(12) United States Patent
Fox et al.

(10) Patent No.: US 11,905,594 B2
(45) Date of Patent: Feb. 20, 2024

(54) CHEMICAL VAPOR DEPOSITION PROCESS FOR PRODUCING DIAMOND

(71) Applicant: The University of Bristol, Bristol (GB)

(72) Inventors: Neil Fox, Bristol (GB); Hugo Dominguez Andrade, Bristol (GB); Thomas B Scott, Bristol (GB); Edward JD Mahoney, Bristol (GB); Alexander Croot, Bristol (GB)

(73) Assignee: The University of Bristol, Bristol (GB)

( * ) Notice: Subject to any disclaimer, the term of this patent is extended or adjusted under 35 U.S.C. 154(b) by 0 days.

(21) Appl. No.: 17/639,490

(22) PCT Filed: Sep. 2, 2020

(86) PCT No.: PCT/GB2020/052101
§ 371 (c)(1),
(2) Date: Mar. 1, 2022

(87) PCT Pub. No.: WO2021/044140
PCT Pub. Date: Mar. 11, 2021

(65) Prior Publication Data
US 2022/0325406 A1 Oct. 13, 2022

(30) Foreign Application Priority Data
Sep. 3, 2019 (GB) ...................... 1912659

(51) Int. Cl.
*C23C 16/27* (2006.01)
*C23C 16/52* (2006.01)

(52) U.S. Cl.
CPC .......... *C23C 16/274* (2013.01); *C23C 16/272* (2013.01); *C23C 16/277* (2013.01); *C23C 16/52* (2013.01)

(58) Field of Classification Search
CPC ....... C23C 16/26; C23C 16/27; C23C 16/274; C23C 16/276; C23C 16/277
See application file for complete search history.

(56) References Cited

U.S. PATENT DOCUMENTS 5,074,245 A    12/1991  Ota et al.
5,236,740 A *   8/1993  Peters ...................... C23F 1/02
                                                            216/100

(Continued)

FOREIGN PATENT DOCUMENTS

EP    0376694 A2    7/1990
EP    0531085 A2    3/1993

(Continued)

OTHER PUBLICATIONS

Teraji, Tokuyuki, et al., "Isotopic enrichment of diamond using microwave plasma-assisted chemical vapor deposition with high carbon conversion efficiency". Thin Solid Films 557 (2014) pp. 231-236.*

(Continued)

*Primary Examiner* — Bret P Chen
(74) *Attorney, Agent, or Firm* — Vorys, Sater, Seymour, and Pease LLP

(57) ABSTRACT

A chemical vapor deposition (CVD) process for producing diamond includes providing a CVD Growth Chamber containing a growth substrate, charging the CVD growth chamber with a source gas mixture that includes a carbon source gas, activating the gas mixture to facilitate growth of diamond on the growth substrate, and providing for a period of diamond growth in a static mode during which the gas mixture is sealed within the CVD growth chamber.

18 Claims, 9 Drawing Sheets

(56) References Cited

U.S. PATENT DOCUMENTS

| | | | |
|---|---|---|---|
| 5,464,665 A | | 11/1995 | Anthony et al. |
| 5,635,256 A | * | 6/1997 | Olson .................. C23C 16/274 427/535 |
| 5,747,118 A | | 5/1998 | Bunshah et al. |
| 6,316,734 B1 | * | 11/2001 | Yang .................... H05K 1/0259 428/209 |
| 6,858,080 B2 | | 2/2005 | Linares et al. |
| 8,110,171 B1 | * | 2/2012 | Roy ........................ C23C 16/27 438/689 |
| 8,642,123 B1 | * | 2/2014 | Kumar .................... C01G 9/03 427/576 |
| 9,663,851 B2 | * | 5/2017 | Levashov ................ C23C 4/18 |
| 2004/0157005 A1 | * | 8/2004 | Tzeng .................. C23C 16/503 427/571 |
| 2005/0005851 A1 | * | 1/2005 | Keshner ........... C23C 16/45578 427/579 |
| 2008/0070815 A1 | * | 3/2008 | Kamada .............. C10M 171/06 508/109 |
| 2009/0090918 A1 | * | 4/2009 | Hobart .................... H01S 5/183 438/105 |
| 2009/0324810 A1 | * | 12/2009 | Serikawa ........... C02F 1/46109 427/78 |
| 2010/0189924 A1 | * | 7/2010 | D'Evelyn ......... H01J 37/32192 427/575 |
| 2014/0154509 A1 | * | 6/2014 | Zhang .................... C04B 35/52 156/304.6 |
| 2014/0209014 A1 | * | 7/2014 | Chang .................. C30B 25/105 204/192.15 |
| 2015/0206748 A1 | * | 7/2015 | Sumant .............. H01L 21/0262 438/481 |
| 2015/0315700 A1 | * | 11/2015 | Pickles ................ C23C 16/274 427/575 |
| 2017/0159205 A1 | * | 6/2017 | Lin ......................... C30B 29/04 |
| 2018/0197724 A1 | * | 7/2018 | Paxton, IV ........... C23C 16/511 |

FOREIGN PATENT DOCUMENTS

| | | | | |
|---|---|---|---|---|
| EP | 0678592 A1 | | 10/1995 | |
| EP | 0930377 A1 | | 7/1999 | |
| JP | 2002-243314 | * | 8/2003 | ........... H01L 21/205 |
| WO | 9629441 A2 | | 9/1996 | |
| WO | WO 2019/055975 A2 | * | 3/2019 | ............. C01B 32/25 |

OTHER PUBLICATIONS

Lee, Joungchel, et al., "Nucleation and bulk film growth kinetics of nanocrystalline diamond prepared by microwave plasma-enhanced chemical vapor deposition on silicon substrates". Applied Physics Letters 69 (12), Sep. 16, 1996, pp. 1716-1718.*

Mesbahi, A., et al., "Study of the influence of gas flow on PECVD diamond growth: inflence of the separate injection of gases." J. Phys. D: Appl. Phys. 50 (2017) 475203 pp. 1-11.*

Truscott, Benjamin, et al., "Microwave Plasma-Activated Chemical Vapor Deposition of Nitrogen-Doped Diamond. II Ch4/N2/H2 Plasmas". The Journal of Physical Chemistry A, 2016, 120, pp. 8537-8549.*

McCune, R.C., et al., "Methodology for adhesion characterization of microwave PECVD diamond films on SiAlON tool inserts". Surface and Coatings Technology, vol. 53, Issue 2, Sep. 15, 1992, pp. 189-197. Abstract Only.*

Su, J., et al., "Revisiting the gas flow rate effect on diamond films deposition with a new dome-shaped cavity type microwave plasma CVD reactor". Diamond and Related Materials, vol. 73, Mar. 2017, pp. 99-104.*

Nistor, L., et al., "Structural Aspects of CVD Diamond Wafers Grown at Different Hydrogen Flow Rates". Phys. Stat. Sol. (a) 174, (1999), pp. 5-9.*

Lai, Guan-Ren, et al., "Deposition of Diamond Films in a Closed Hot Filament CVD System". Journal of Research of the National Institute of Standards and Technology, vol. 100, No. 1, Jan.-Feb. 1995, pp. 43-49.*

Solel, Talia; Analysing the Growth Characteristics of a Pulsed Direct Current Plasma Deposition Reactor (PDC PDR); University of Bristol School of Chemistry.

Bachmann, P.K. (1990), Diamond thin film technology I. Diamond deposition. Adv. Mater., 2: 195-199. https://doi.org/10.1002/adma.19900020410.

Koizumi et al., "Physics and Applications of CVD Diamond" ISBN: 978-3-527-40801-6, Aug. 2008, p. 31, sect 3.1.2.

C.J. Tang, A.U.S. Fernandes, Marco Granada, J.P. Leitão, S. Pereira, X.F. Jiang, J.L. Pinto, H. Ye, High rate growth of hanocrystalline diamond films using high microwave power and pure nitrogen/methane/hydrogen plasma, Vacuum, vol. 122, Part B, 2015, pp. 342-346, ISSN 0042-207X, https://doi.org/10.1016/j.vacuum.2015.03.021.

A.P. Bolshakov, V.G. Ralchenko, V.Y. Yurov, A.F. Popovich, I.A. Antonova, A.A. Khomich, E.E. Ashkinazi, S.G. Ryzhkov, A.V. Vlasov, A.V. Khomich, High-rate growth of single crystal diamond in microwave plasma in CH4/H2 and CH4/H2/Ar gas mixtures in presence of intensive soot formation, Diamond and Related Materials, vol. 62, 2016, pp. 49-57, ISSN 0925-9635, https://doi.org/10.1016/j.diamond.2015.12.001.

May, Paul W.. "Diamond thin films: a 21st-century material." Philosophical Transactions of the Royal Society of London. Series A: Mathematical, Physical and Engineering Sciences 358 (2000): 473-495.

Ashfold, Michael & Mahoney, Ed & Mushtaq, Sohail & Truscott, Benjamin & Mankelevich, Yuri. (2017). What [plasma used for growing] diamond can shine like flame ?. Chem. Commun.. 53. 10482. 10.1039/C7CC05568D.

Butler, James E. et al. "Understanding the chemical vapor deposition of diamond: recent progress." Journal of Physics: Condensed Matter 21 (2009): 364201.

Yuri A. Mankelevich, Michael N. R. Ashfold, and Jie Ma , "Plasma-chemical processes in microwave plasma-enhanced chemical vapor deposition reactors operating with C/H/Ar gas mixtures", Journal of Applied Physics 104, 113304 (2008) https://doi.org/10.1063/1.3035850.

Derkaoui, N. & Rond, Cathy & Hassouni, Khaled & Gicquel, Alix. (2014). Spectroscopic analysis of H2/CH4 microwave plasma and fast growth rate of diamond single crystal. Journal of Applied Physics. 115. 233301-233301. 10.1063/1.4883955.

Lombardi, G. & Hassouni, Khaled & Stancu, G & Mechold, L & Röpcke, J & Gicquel, Alix. (2005). Study of an H2/CH4 moderate pressure microwave plasma used for diamond deposition: Modelling and IR tuneable diode laser diagnostic. Plasma Sources Science and Technology. 14. 440. 10.1088/0963-0252/14/3/005.

Rabeau, J. & Fan, Yiting & John, Princess & Wilson, John. (2004). The role of C2 in nanocrystalline diamond growth. Journal of Applied Physics. 96. 10.1063/1.1810637.

Truscott, Benjamin & Kelly, Mark & Potter, Katie & Ashfold, Michael & Mankelevich, Yuri. (2016). Microwave Plasma-Activated Chemical Vapour Deposition of Nitrogen-Doped Diamond, II: CH 4 /N 2 /H 2 Plasmas. The Journal of Physical Chemistry A. 120. 10.1021/acs.jpca.6b09009.

Richley, James & Kelly, Mark & Ashfold, Michael & Mankelevich, Yuri. (2012). Optical Emission from Microwave Activated C/H/O Gas Mixtures for Diamond Chemical Vapor Deposition. The journal of physical chemistry. A. 116. 9447-58. 10.1021/jp306191y.

Jin and T. D. Moustakas , "Effect of nitrogen on the growth of diamond films", Appl. Phys. Lett. 65, 403-405 (1994) https://doi.org/10.1063/1.112315.

Mueller-Sebert, Wolfgang & Worner, E. & Fuchs, F. & Wild, C. & Koidl, P .. (1996). Nitrogen induced increase of growth rate in chemical vapor deposition of diamond. Applied Physics Letters. 68. 759-760. 10.1063/1.116733.

Chayahara, A. & Mokuno, Y. & Horino, Yui & Takasu, Y. & Kato, H. & Yoshikawa, H. & Fujimori, N.. (2004). The effect of nitrogen addition during high-rate homoepitaxial growth of diamond by microwave plasma CVD. Diamond and Related Materials. 13. 1954-1958. 10.1016/j.diamond.2004.07.007.

Achard, Jocelyn & Silva, François & Brinza, Ovidiu & Tallaire, Alexandre & Gicquel, Alix. (2007). Coupled effect of nitrogen addition and surface temperature on the morphology and the kinet-

(56) References Cited

OTHER PUBLICATIONS ics of thick CVD diamond single crystals. Diamond and Related Materials. 16. 685-689. 10.1016/j.diamond.2006.09.012.

Bogdanov, Sergey & Vikharev, Anatoly & Gorbachev, Aleksei & Muchnikov, Anatoly & Radishev, Dmitry & Ovechkin, Nikolai & Parshin, V.V.. (2014). Growth-rate Enhancement of High-quality, Low-loss CVD-produced Diamond Disks Grown for Microwave Windows Application. Chemical Vapor Deposition. 20. 10.1002/cvde.201307058.

Stephen J. Harris and Anita M. Weiner, "Effects of oxygen on diamond growth", Appl. Phys. Lett. 55, 2179-2181 (1989) https://doi.org/10.1063/1.102350.

Yasushi Muranaka, Hisao Yamashita, Kouji Sato, and Hiroshi Miyadera, "The role of hydrogen in diamond synthesis using a microwave plasma in a CO/H2 system", Journal of Applied Physics 67, 6247-6254 (1990) https://doi.org/10.1063/1.345191.

Kawato, Takashi and Ken-ichi Kondo. "Effects of Oxygen on CVD Diamond Synthesis." Japanese Journal of Applied Physics 26 (1987): 1429-1432.

Celii, Francis G., David White and Andrew J. Purdes. "Effect of residence time on microwave plasma chemical vapor deposition of diamond." Journal of Applied Physics 70 (1991): 5636-5646.

Celii, Francis G., David White and Andrew J. Purdes. "Deposition of smooth, oriented diamond films using microwave plasma chemical vapor deposition." Thin Solid Films 212 (1992): 140-149.

J. Su, Y. Li, Y. Liu, M. Ding, W. Tang, Revisiting the gas flow rate effect on diamond films deposition with a new dome-shaped cavity type microwave plasma CVD reactor, Diamond and Related Materials, vol. 73, 2017, pp. 99-104, ISSN 0925-9635, https://doi.org/10.1016/j.diamond.2016.07.014.

Nistor, Sergiu & Stefan, Mariana & Ralchenko, V. & Khomich, A.V. & Schoemaker, Dirk. (2000). Nitrogen and hydrogen in thick diamond films grown by microwave plasma enhanced chemical vapor deposition at variable H2 flow rates. Journal of Applied Physics. 87. 8741-8746. 10.1063/1.373604.

Croot, Alex & Wan, Yuet Mun Gary & Rowan, Alex & Andrade, Hugo & Smith, James & Fox, Neil. (2017). Beta Radiation Enhanced Thermionic Emission from Diamond Thin Films. Frontiers in Mechanical Engineering. 3. 10.3389/fmech.2017.00017.

Western, Colin. (2016). PGOPHER: A Program for Simulating Rotational, Vibrational and Electronic Spectra. Journal of Quantitative Spectroscopy and Radiative Transfer. 186. 10.1016/j.jqsrt.2016.04.010.

Yan, Xiongbo & Wei, Junjun & An, Kang & Zhao, Yun & Liu, Jinlong & Li, Cheng-ming & Hei, Lifu & Li, Chengming. (2018). Quantitative study on graphitization and optical absorption of CVD diamond films after rapid heating treatment. Diamond and Related Materials. 87. 10.1016/j.diamond.2018.04.011.

Yusuke Taki, Osamu Takai, XPS structural characterization of hydrogenated amorphous carbon thin films prepared by shielded arc ion plating, Thin Solid Films, vol. 316, Issues 1-2, 1998, pp. 45-50, ISSN 0040-6090, https://doi.org/10.1016/S0040-6090(98)00386-1.

R. Frank, V. Drach, and J. Fricke, "Determination of thermal conductivity and specific heat by a combined 3ω/decay technique", Review of Scientific Instruments 64, 760-765 (1993) https://doi.org/10.1063/1.1144156.

Ma, Jie & Ashfold, Michael & Mankelevich, Yuri. (2009). Validating optical emission spectroscopy as a diagnostic of microwave activated CH4/Ar/H2 plasmas used for diamond chemical vapor deposition. Journal of Applied Physics. 105. 043302 - 043302. 10.1063/1.3078032.

Mahoney, Ed & Truscott, Benjamin & Ashfold, Michael & Mankelevich, Yuri. (2017). Optical Emission from C 2—Anions in Microwave-Activated CH 4 /H 2 Plasmas for Chemical Vapor Deposition of Diamond. The Journal of Physical Chemistry A. 121. 10.1021/acs.jpca.7b00814.

Cheesman, Andrew & Harvey, Jeremy & Ashfold, Michael. (2008). Studies of Carbon Incorporation on the Diamond {100} Surface during Chemical Vapor Deposition using Density Functional Theory. The journal of physical chemistry. A. 112. 11436-48. 10.1021/jp8034538.

Butler, James E, and Ivan Oleynik. "A mechanism for crystal twinning in the growth of diamond by chemical vapour deposition." Philosophical transactions. Series A, Mathematical, physical, and engineering sciences vol. 366, 1863 (2008): 295-311; discussion 311. doi:10.1098/rsta.2007.2152.

GB Search Report from corresponding GB Application No. GB1912659.8 dated Feb. 20, 2020.

Written Opinion and International Search Report from corresponding PCT Application No. PCT/GB2020/052101 dated Mar. 9, 2021.

International Search Report and Written Opinion for corresponding PCT application PCT/GB2020/052101, dated Mar. 9, 2021.

\* cited by examiner

CHEMICAL VAPOR DEPOSITION PROCESS FOR PRODUCING DIAMOND

FIELD OF THE INVENTION

The present invention is directed to chemical vapor deposition (CVD) processes for producing diamond (i.e. synthetic diamond).

BACKGROUND OF THE INVENTION

Diamond can be produced by chemical vapor deposition (CVD). CVD methods rely on a gas phase chemical reaction occurring on top of a substrate. This gas phase contains, among other species, a carbon precursor gas and molecules of the carbon precursor gas are dissociated via thermal decomposition so that carbon atoms are deposited on the substrate in the form of diamond (see, for example: Bachmann 1990; and Physics and Applications of CVD Diamond 2008).

CVD methods include: hot filament CVD (HF-CVD); microwave plasma CVD (MW-CVD); DC plasma CVD (DC-CVD); DC pulsed plasma CVD (DCP-CVD); radio frequency CVD (RF CVD); and combustion flame CVD).

Conventionally, combustion flame CVD utilises a gas flow on the order of litres per minute and the growth process is carried out at atmospheric pressure.

Conventionally, HF-CVD, MW-CVD, DC-CVD, DCP-CVD and RF CVD are carried out inside vacuum chambers at a pressure below atmospheric pressure that is maintained low by means of a vacuum pump and a valve while precursor gasses are continuously flowed through the CVD growth chamber, each with a certain flow rate, with a typical flow rate of the order of 1 to 500 sccm. (sccm=standard cubic centimetres per minute). To form diamond, the gas phase containing the carbon precursors needs to be activated. Activation of the gas phase may be carried out thermally (such as in HF-CVD) or by a plasma (e.g. by providing a microwave plasma, DC plasma, DC pulsed plasma or RF plasma). Conventionally, the gas mixture containing the carbon precursor gas is constantly flowed through the CVD growth chamber to maintain the desired gas ratios within the gas mixture that could change due to depletion of one of the species due to deposition on the growth substrate or the walls of the chamber. Therefore, the rate of utilization of precursor gasses in CVD growth is very high, and most of the carbon precursor gas is actually not deposited as diamond in the substrate but pumped out of the CVD chamber and released to the atmosphere.

The properties exhibited by diamond make diamond a particularly desirable allotrope of carbon. Diamond's high thermal conductivity and low thermal expansion coefficient make diamond an extremely good material for thermal management in electronics, whilst its high refractive index, low birefringence and exceptionally broad optical transparency make it applicable for optical windows and desirable as a lasing material. Additionally, diamond is a wide band-gap material, which upon boron doping can demonstrate p-type semiconducting, metallic or superconducting behaviour, facilitating its use as an active component in electronic applications.

Chemical vapor deposition (CVD) methods can be used to produce diamond films with morphologies ranging from nano- to micro-polycrystalline through to larger high-quality single crystal diamonds (see: Tang 2015; and Bolshakov 2016). Conventionally, this is achieved by flowing methane diluted (to just a few percent) with hydrogen into a growth chamber, and activating the gas mixture (most commonly by a microwave (MW) plasma (see: May 2000; Ashfold 2017; Tang 2015; and Bolshakov 2016). The processes occurring within MW activated C/H plasmas that facilitate diamond growth are by now reasonably well understood, as are the conditions required to ensure suitably high densities of the species important for growth (notably $CH_3$ radicals and H atoms) directly above the growing surface (see: Ashfold 2017; Butler 2009; Mankelevich 2008; Derkaoui 2014; Lombardi 2005; and Rabeau 2004). Many of the key processes occurring in MW activated C/H/N (see Truscott 2016) and C/H/O (see Richley 2012) plasmas are similarly reasonably well understood, as are at least some of the effects that that both O and N can have on diamond growth rate, crystal quality and morphology (see: Jin 1994; Müller-Sebert 1996; Chayahara 2004; Achard 2007; Bogdanov 2013; Kawato 1987; Harris 1989; and Muranaka 1990). The presence of trace amounts of oxygen and nitrogen generally lead to an increase in diamond growth rate but to the detriment of quality, (see: Jin 1994; Müller-Sebert 1996; Chayahara 2004; Achard 2007; Bogdanov 2013; Kawato 1987; Harris 1989; and Muranaka 1990) with nitrogen encouraging the growth of (100) facets and twinning along the (111)-orientation (see Achard 2007; and Bogdanov 2013).

Conventional CVD uses a premixed source gas. A stable process pressure (that is almost always below atmospheric pressure) is achieved by matching the gas input and exhaust flow rates. The residence time is defined as the time that it takes to replace the entire gas content of the chamber at a particular pressure and gas flow conditions. The residence time is inversely proportional to the gas flow rate. Prior investigations of the effects of gas flow rate on diamond growth rates and morphology have yielded contradictory findings. Celii 1991 and Celi 1992 for example, reported MW plasma activated diamond CVD growth studies (on both Si and diamond substrates) in which the residence time was varied by more than a factor of thirty. While Raman, photoluminescence (PL) and X-ray diffraction data for the as-grown material all showed some sensitivity to the gas flow rate employed, other material properties (electrical resistivity, IR transmission, deposited film thickness) and the optical emission spectra of the plasma were found to be rather insensitive to the flow rate. Flow modelling suggested the importance of convective flow at the low pressures (40 Torr) used in that study, and the authors argued that the presence of vortices above the growing diamond surface likely complicated the concept of residence time for their experiments (Su 2017).

Conventionally, trace amounts of air enter the CVD process either as an impurity in the input source gas mixture or via small leaks into the reactor volume and associated pipework. The use of higher flow rates (shorter residence times) should reduce the relative importance of any such contribution from reactor leaks. Such expectations are consistent with studies by Nistor et al., (Nistor 2000) for example, who demonstrated a decrease in N-related defects in material grown at higher gas flow rates (up to about 1000 sccm), and by Su et al., (Su 2017) who reported increased quality and reduced growth rates when using hydrogen gas flow rates in of around 1000 sccm.).

It is known that the two main requirements in order to successfully grow synthetic diamond are that the growth conditions are constant and controlled and the gas mixture used to grow the diamond is low in impurities. Traditionally, these two requirements for successful synthetic diamond growth have been met by providing a continuous and relatively high source gas flow (for example a source gas flow above about 100 sccm, e.g. about 300 sccm) over the diamond growth substrate. The traditional view has been that the large amounts of waste gas produced using these methods is necessary in order to produce the desired quality and growth rate of synthetic diamond. Attempts at using much lower flow rates of CVD source gases to produce diamond of high crystalline quality have not been considered to be viable approach, not only due to possible (uncontrolled) enrichment of nitrogen impurities (for example as discussed by Su 2017 and Nistor 2000), but also because diamond growth at very low flow rates was thought to be constrained by the depletion of carbon depositing species (see, for example Su 2017), which was thought to be caused by a rapid depletion of carbon radicals, identified through observing the optical emission intensities of the $C_2(d^3\Pi_g \leftarrow a^3\Pi_u)$ $\Delta v=0$ and $CH(A^2\Delta \leftarrow X^2\Pi)$ $\Delta v=0$ emissions (which may be referred to as $/(C_2^*)$ and $/(CH^*)$) that are present in the source gas.

SUMMARY OF THE INVENTION

The present inventors have identified that the use of conventional CVD processes to produce diamond, which employ a continuous flow of source gases, results in large amounts of waste gas which are conventionally released to the atmosphere.

As discussed above, although it was previously understood that employing low flow rates of source gases in CVD processes would not successfully provide synthetic diamond, at least due to depletion of carbon depositing species from the source gas, the present inventors have found that carbon depositing species are absorbed from the source gas much more slowly than previously thought. Therefore, the present inventors have determined that synthetic diamond can be grown using a CVD process as described herein in which the flow rate of a source gas over a diamond growth substrate may be very low (e.g. substantially no flow over the substrate).

The present inventors have also found that diamond can be successfully produced using a chemical vapor deposition (CVD) process in which the gas mixture comprising a carbon precursor gas is sealed within the CVD growth chamber for at least a period of growth of the diamond, i.e. in processes operating in "static mode" for at least a period of diamond growth where a carbon precursor gas present in the gas mixture is depleted during this period of diamond growth (rather than the conventional technique of continuously flowing a gas mixture comprising a carbon precursor gas over a substrate in a CVD growth chamber such that the gas flow into the CVD growth chamber is the same as the gas flow exiting the CVD growth chamber via a gas exhaust). Furthermore, the present inventors have found that not only can diamond be produced using chemical vapor deposition processes described herein, but that additionally these processes provide a huge increase in the conversion of carbon contained in a source gas to diamond.

Additionally, the present inventors have found that monitoring the composition of gases in the CVD chamber during the processes described herein provides additional benefits in relation to determining an end point of diamond growth, or ensuring the composition of the gas mixture meets particular requirements (for example by determining the composition of the gas mixture within the CVD growth chamber and then allowing for a top-up of precursor gases). For example, the process described herein may comprise employing optical emission spectroscopy (OES) and/or a residual gas analyser (RGA) to analyse the composition of the gas mixture. OES allows for the monitoring in real time of the chemical composition of the plasma formed due to the excitation of the gas mixture in the CVD chamber. RGA allows for the monitoring in real time of the gases that are in the CVD chamber or being injected into the CVD chamber. The present inventors have found that providing for the monitoring of the composition of the gas mixture in the CVD chamber, the conversion of gas phase carbon to solid diamond can be further improved.

The processes described herein may also provide benefits in relation to reducing the production costs in producing diamond, or mitigating health and safety issues when using expensive, rare, toxic or even radioactive source gases.

The present inventors have found that the processes described herein can be successfully employed for the manufacture of synthetic diamond including isotopically pure diamond, $^{13}C$ containing diamond, and/or $^{14}C$ containing diamond.

In a first aspect, the present invention provides a chemical vapor deposition (CVD) process for producing diamond, the process comprising:
  providing a CVD growth chamber containing a growth substrate;
  charging the CVD growth chamber with a gas mixture, the gas mixture comprising a carbon source gas;
  activating the gas mixture to facilitate growth of diamond on the growth substrate; and
  providing for a period of diamond growth during which the gas mixture is sealed within the CVD growth chamber.

In an aspect, the present invention provides a chemical vapor deposition (CVD) process for producing diamond, the process comprising:
  providing a CVD growth chamber containing a growth substrate;
  charging the CVD growth chamber with a gas mixture, the gas mixture comprising a carbon source gas;
  activating the gas mixture to facilitate growth of diamond on the growth substrate; and
providing for a period of diamond growth during which the gas mixture is hermetically sealed within the CVD growth chamber.

In an aspect, the present invention provides a chemical vapor deposition (CVD) process for producing diamond, the process comprising:
  providing a CVD growth chamber containing a growth substrate;
  charging the CVD growth chamber with a gas mixture, the gas mixture comprising a carbon source gas;
  activating the gas mixture to facilitate growth of diamond on the growth substrate;
providing for a period of diamond growth during which the gas mixture is sealed within the CVD growth chamber; and
monitoring the composition of the gas mixture within the CVD chamber during diamond growth.

In an aspect, the present invention provides a chemical vapor deposition (CVD) process for producing diamond, the process comprising:
  providing a CVD growth chamber containing a growth substrate;
  charging the CVD growth chamber with a gas mixture, the gas mixture comprising a carbon source gas;
  activating the gas mixture to facilitate growth of diamond on the growth substrate;
providing for a period of diamond growth during which the gas mixture is sealed within the CVD growth chamber; and ending the period of diamond growth by evacuating the gas mixture from the CVD growth chamber.

DETAILED DESCRIPTION

Figure 1:
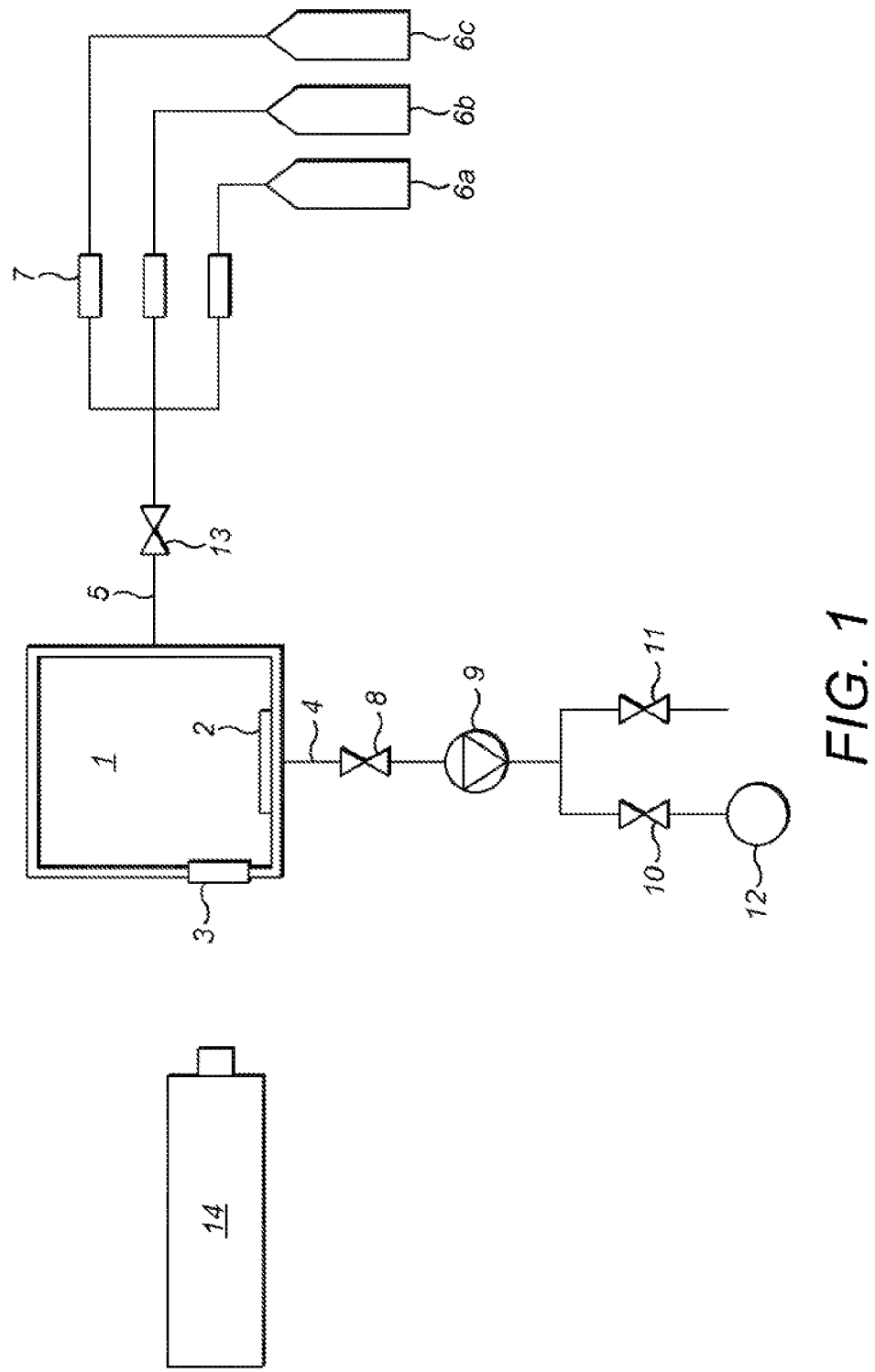
FIG. 1 is a schematic diagram of a CVD apparatus comprising a CVD reaction chamber.

The present invention provides a chemical vapor deposition (CVD) process for producing diamond.

The terms "diamond" and "diamond material" are used herein to refer to a material composed of diamond. The skilled person understands that diamond can be described as a crystalline material (a polycrystalline material or a single crystal material). The skilled person also understands that diamond can be described as the diamond allotrope of carbon in which carbon atoms are arranged in a cubic Bravais lattice over which is laid a four-atom tetrahedral motif.

Diamond (or diamond material) may contain at least about 90% $sp^3$ bonds, for example at least about 95% $sp^3$ bonds, at least about 97% $sp^3$ bonds, at least about 98% $sp^3$ bonds, at least about 99% $sp^3$ bonds, at least about 99.5% $sp^3$ bonds, at least about 99.9% $sp^3$ bonds, or about 100% $sp^3$ bonds. The $sp^3$ bond content in the diamond material may be determined by methods known to the skilled person, for example using X-ray photoelectron spectroscopy (XPS) (for example, as described by Yan 2018 and Taki 1998.

The skilled person understands that diamond may have a single active Raman mode at 1332 $cm^1$.

The diamond (or diamond material) may have a band gap at room temperature (about 25° C.) of greater than about 5.3 eV, or about 5.4 eV or greater, or about 5.5 eV.

The diamond (or diamond material) may have a thermal conductivity measured at room temperature (about 25° C.) of greater than about 100 W/mK, for example, greater than about 500 W/mK, greater than about 1000 W/mK, greater than about 1500 W/mK, or greater than about 2000 W/mK, or about 2200 W/mK or greater. Thermal conductivity of diamond may be determined according to the 3ωmethod (Frank 1993).

The diamond (or diamond material) may have a density of greater than about 3300 $kg/m^3$, for example greater than about 3400 $kg/m^3$, or greater than about 3500 $kg/m^3$.

The term "CVD growth chamber" is used herein to refer to a vacuum chamber in which CVD growth of diamond, may be carried out. The CVD growth chamber may comprise a substrate support (for example, a heatable substrate support) for supporting a substrate on which a diamond may be grown. The CVD growth chamber may comprise a gas inlet through which a carbon source gas, or a gas mixture comprising a carbon source gas, may be introduced to the CVD growth chamber. The gas inlet may be sealable to allow gas to be prevented from entering or leaving the CVD growth chamber through the gas inlet. The CVD growth chamber may form part of a CVD apparatus. The CVD growth chamber may comprise a gas exhaust outlet (e.g. a sealable gas exhaust outlet) from which gas may be removed from the CVD growth chamber. In certain embodiments, the CVD apparatus comprises a CVD growth chamber comprising a gas exhaust outlet from which gas may be removed from the CVD growth chamber; and a gas capture device in fluid communication with the gas exhaust outlet of the CVD growth chamber (for example, such that gas removed from the CVD growth chamber is prevented from escaping to the atmosphere). In certain embodiments, the gas capture device is configured to remove contaminants from the gas mixture removed from the CVD growth chamber (for example, such that the cleaned gas mixture may be returned to the CVD growth chamber). For example, a gas capture device may comprise a contaminant removal composition to remove contaminants from the gas mixture. The contaminant removal composition may comprise, consist essentially of or consist of activated charcoal. In certain embodiments, the cleaned gas mixture may be returned to the CVD growth chamber via a cleaned gas mixture inlet.

The CVD growth chamber is provided with a growth substrate on which diamond may be grown. The growth substrate may comprise a seeded substrate, for example a substrate seeded with nano-diamond particles (see, for example, Croot 2017). The growth substrate may be any substrate suitable for growing diamond. Examples of materials which are suitable to form the growth substrate for growing diamond include silicon, molybdenum, quartz, iridium and diamond.

In order for diamond to be grown in the CVD growth chamber, a carbon source gas is charged into the CVD growth chamber.

In embodiments, prior to charging a carbon source gas or gas mixture as described herein into the CVD growth chamber, a vacuum is applied to the CVD growth chamber to reduce the pressure of the CVD growth chamber to a pressure of less than about 1 Torr, for example less than about 1 mTorr, or about 1 µTorr or less. Suitably the CVD growth chamber is evacuated to a pressure of about 1 µTorr or less prior to the CVD growth chamber being charged with the gas mixture. In certain embodiments, the pressure of the growth chamber may be reduced, for example, to about 0.1 µTorr or less, or about 0.01 µTorr or less.

The terms "carbon source gas" and "carbon precursor gas" are used interchangeably herein and are used herein to refer to any gas that may be used to deliver carbon to form diamond, e.g. a gas comprising molecules containing carbon atoms. For example, the carbon source gas may be a hydrocarbon containing gas such as an alkane, e.g. methane, or acetylene. In embodiments, the carbon source gas is methane.

In embodiments, the carbon source gas comprises $^{12}C$ isotopes of carbon. In embodiments, the carbon source gas comprises an increased $^{12}C$ content compared to the natural isotopic abundance of $^{12}C$, for example the carbon source gas may contain greater than 99% $^{12}C$ by atom % of the total number of carbon atoms contained in the carbon source gas, for example greater than about 99.5% $^{12}C$, greater than 99.6% $^{12}C$, greater than 99.7% $^{12}C$, greater than 99.8% $^{12}C$, greater than 99.9% $^{12}C$, greater than 99.95% $^{12}C$, greater than 99.99% $^{12}C$, greater than 99.999% $^{12}C$, greater than 99.9999% $^{12}C$, or about 99.9999% $^{12}C$ or greater by atom % of the total number of carbon atoms contained in the carbon source gas. A carbon source gas containing 99.9999% $^{12}C$ or greater may considered to be an isotopically pure $^{12}C$ carbon source gas.

In embodiments, the carbon source gas comprises $^{13}C$ isotopes of carbon. In embodiments, the carbon source gas comprises an increased $^{13}C$ content compared to the natural isotopic abundance of $^{13}C$, for example the carbon source gas may contain greater than 1.1% $^{13}C$ by atom % of the total number of carbon atoms contained in the carbon source gas, for example greater than about 1.5% $^{13}C$, greater than 2% $^{13}C$, greater than 5% $^{13}C$, greater than 10% $^{13}C$, greater than 50% $^{13}C$, greater than 75% $^{13}C$, greater than 80% $^{13}C$, greater than 90% $^{13}C$, greater than 95% $^{13}C$, greater than 99% $^{13}C$, greater than 99.5% $^{13}C$, greater than 99.9% $^{13}C$, or greater than 99.99% $^{13}C$ by atom % of the total number of carbon atoms contained in the carbon source gas. A carbon source gas containing 99.99% $^{13}C$ or greater by atom % of the total number of carbon atoms contained in the carbon source gas may be considered to be isotopically pure with respect to $^{13}C$.

In embodiments, the carbon source gas comprises $^{14}C$ isotopes of carbon. In embodiments, the carbon source gas comprises an increased $^{14}C$ content compared to the natural isotopic abundance of $^{14}C$, for example the carbon source gas may contain greater than 1 $^{14}C$ by atom % of the total number of carbon atoms contained in the carbon source gas, for example greater than about 1.5% $^{14}C$, greater than 2% $^{14}C$, greater than 5% $^{14}C$, greater than 10% $^{14}C$, greater than 50% $^{14}C$, greater than 75% $^{14}C$, greater than 80% $^{14}C$, greater than 90% $^{14}C$, greater than 85% $^{14}C$, greater than 99% $^{14}C$ by total weight of carbon atoms, or about 99.9% or greater $^{14}C$ by atom % of the total number of carbon atoms contained in the carbon source gas. A carbon source gas containing 99.9% $^{14}C$ or greater by atom % of the total number of carbon atoms contained in the carbon source gas may be considered to be isotopically pure with respect to $^{14}C$.

A gas mixture may be charged to the CVD growth chamber. The gas mixture may comprise a carbon source gas as described herein. The gas mixture may comprise a carbon source gas and a hydrogen source gas (e.g. a carbon source gas and hydrogen gas). In certain embodiments, charging the CVD growth chamber with a gas mixture comprises charging a CVD growth chamber with a pre-mixed gas mixture. In certain embodiments, charging the CVD growth chamber with a gas mixture comprises charging a CVD growth chamber with a carbon source gas and any other components of the gas mixture to form a gas mixture in the CVD growth chamber (i.e. the components of the gas mixture may be separately charged to the CVD growth camber to form a gas mixture in the CVD growth chamber. In certain embodiments, the gas mixture further comprises an oxygen source gas, e.g. oxygen gas or carbon dioxide gas. In certain embodiments, the gas mixture further comprises a nitrogen source gas, e.g. nitrogen gas or ammonia gas. In certain embodiments, the gas mixture further comprises a boron source gas, e.g. $B_2H_6$ gas. In certain embodiments, the gas mixture further comprises argon gas. In certain embodiments, the gas mixture comprises a carbon source gas and a hydrogen source gas and optionally an oxygen source gas, a nitrogen source gas, a boron source gas, argon gas or combinations thereof.

In embodiments, the hydrogen source gas comprises hydrogen gas ($H_{2(g)}$). In embodiments, the hydrogen source gas is hydrogen gas ($H_{2(g)}$). In embodiments, the hydrogen gas comprises hydrogen gas having a natural isotopic abundance of protium, deuterium and tritium. In embodiments, the hydrogen gas consists solely of protium. In embodiments, the hydrogen comprises an increased deuterium content compared to the natural isotopic abundance of deuterium, for example comprising greater than about 1% deuterium by atom % of the total number of hydrogen atoms contained in the hydrogen gas, for example greater than 5%, greater than 10%, greater than 20%, greater than 50%, greater than 75%, greater than 90%, greater than 95%, greater than 99% or about 99.9% or greater deuterium by atom % of the total number of hydrogen atoms contained in the hydrogen gas. Furthermore, when the hydrogen gas comprises an increased deuterium content compared to the natural isotopic abundance of deuterium, the carbon source gas may comprise, consist of or consist essentially of a deuterated hydrocarbon, for example deuterated methane. In embodiments, the hydrogen gas comprises an increased tritium content compared to the natural isotopic abundance of tritium, for example comprising greater than about 1% tritium by atom % of the total number of hydrogen atoms contained in the hydrogen gas, for example greater than 5%, greater than 10%, greater than 20%, greater than 50%, greater than 75%, greater than 90%, greater than 95%, greater than 99% or about 99.9% or greater tritium by atom % of the total number of hydrogen atoms contained in the hydrogen gas.

In certain embodiments the gas mixture comprises a carbon source gas (e.g. methane) and hydrogen gas. In certain embodiments, the gas mixture comprises additional gaseous components in addition to the carbon source gas and hydrogen gas (for example, the gas mixture may also comprise an oxygen source gas, a nitrogen source gas, a boron source gas argon gas or combinations thereof).

The gas mixture may comprise a carbon source gas (e.g. methane) in an amount of greater than about 0.1 volume % by total volume of the gas mixture, for example at least about 0.5 vol. % carbon source gas by total volume of the gas mixture, or at least about 1 vol. % carbon source gas (e.g.

methane) by total volume of the gas mixture. In certain embodiments, the gas mixture comprises up to about 25 vol. % carbon source gas by total volume of the gas mixture, for example up to about 20 vol. % carbon source gas by total volume of the gas mixture, up to about 15 vol. % carbon source gas by total volume of the gas mixture, up to about 10 vol. % carbon source gas by total volume of the gas mixture, or up to about 5 vol. % carbon source gas by total volume of the gas mixture. In certain embodiments, the gas mixture comprises from about 0.1 vol. % to about 25 vol. % carbon source gas by total volume of the gas mixture, for example from about 0.1 vol. % to about 20 vol. % carbon source gas by total volume of the gas mixture, from about 0.1 vol. % to about 15 vol. % carbon source gas by total volume of the gas mixture, from about 0.1 vol. % to about 10 vol. % carbon source gas by total volume of the gas mixture, from about 0.5 vol. % to about 10 vol. % carbon source gas by total volume of the gas mixture, from about 0.5 vol. % to about 5 vol. % carbon source gas by total volume of the gas mixture, or from about 1 vol. % to about 10 vol. % carbon source gas by total volume of the gas mixture, or from about 1 vol. % to about 5 vol. % carbon source gas by total volume of the gas mixture. In certain embodiments, the remaining balance of the gas mixture is made up of hydrogen gas.

In certain embodiments, the gas mixture comprises up to about 99.9 vol. % of a hydrogen source gas (e.g. hydrogen gas) by total volume of the gas mixture, for example up to about 99 vol. % of a hydrogen source gas (e.g. hydrogen gas) by total volume of the gas mixture. In certain embodiments, the gas mixture comprises at least about 75 vol. % of a hydrogen source gas (e.g. hydrogen gas) by total volume of the gas mixture, for example at least about 80 vol. %, at least about 90 vol. %, or at least about 95 vol. % of a hydrogen source gas (e.g. hydrogen gas) by total volume of the gas mixture. In certain embodiments, the gas mixture comprises from about 75 vol. % to about 99.9 vol. % hydrogen source gas by total volume of the gas mixture, for example from about 80 vol. % to about 99.9 vol. % hydrogen source gas by total volume of the gas mixture, from about 90 vol. % to about 99.9 vol. % hydrogen source gas by total volume of the gas mixture, from about 95 vol. % to about 99.9 vol. % hydrogen source gas by total volume of the gas mixture, or from about 95 vol. % to about 99 vol. % hydrogen source gas by total volume of the gas mixture.

In certain embodiments, the gas mixture comprises: from about 0.1 vol. % to about 10 vol. % carbon source gas (e.g. methane) by total volume of the gas mixture; and from about 90 vol. % to about 99.9 vol. % hydrogen source gas (e.g. hydrogen gas) by total volume of the gas mixture. In certain embodiments, the gas mixture comprises: from about 1 vol. % to about 10 vol. % carbon source gas (e.g. methane) by total volume of the gas mixture; and from about 90 vol. % to about 99 vol. % hydrogen source gas (e.g. hydrogen gas) by total volume of the gas mixture. In certain embodiments, the gas mixture comprises: from about 1 vol. % to about 5 vol. % carbon source gas (e.g. methane) by total volume of the gas mixture; and from about 95 vol. % to about 99 vol. % hydrogen source gas (e.g. hydrogen gas) by total volume of the gas mixture.

In embodiments, after the CVD growth chamber is charged with the gas mixture, the CVD growth chamber is sealed. The CVD growth chamber may be sealed to ensure that during growth of diamond, the gas mixture remains in the CVD growth chamber, for example so that none of the gas mixture is released to the atmosphere. In certain embodiments, the CVD growth chamber is sealed such that when a gas mixture is contained in the growth chamber at a pressure of 10-500 Torr, for example 20-500 Torr, or 30-130 Torr, leakage of a gas such as air into the sealed CVD chamber, for example from air at a standard pressure outside the chamber, occurs at a leak rate of less than about 0.1 mTorr/min, for example less than about 0.01 mTorr/min, less than about 0.05 mTorr/min, or less than about 0.001 mTorr/min. In certain embodiments, the CVD growth chamber is hermetically sealed (i.e. the leak rate into the hermetically sealed growth chamber containing the gas mixture at a pressure of 10-500 Torr, for example 20-500 Torr, 30-130 Torr, or about 15 Torr is substantially zero, for example less than about 0.01 μtorr/min, for example less than about 0.001 μtorr/min).

In certain embodiments, at least a component of the gas mixture is charged into the CVD growth chamber such that the pressure within the CVD growth chamber is at least about 5 Torr, for example at least about 10 Torr, or at least about 15 Torr, prior to activating the gas mixture. In certain embodiments, the CVD growth chamber is charged with hydrogen gas such that the pressure within the CVD growth chamber is at least about 5 Torr, for example at least about 10 Torr, or at least about 15 Torr, prior to activating the gas mixture.

The gas mixture charged to the CVD growth chamber is activated to facilitate diamond growth. The term "activated to facilitate diamond growth" is used herein to refer to activation (e.g. thermally or electrically) of the gas mixture to enable the formation of methyl radicals from the carbon-source gas of the gas mixture. It is this formation of methyl radicals which allows for diamond to be grown.

In embodiments, the gas mixture charged to the CVD growth chamber is thermally activated to facilitate diamond growth. The gas mixture may be thermally activated by employing hot filament CVD in which a filament within the CVD growth chamber is heated to a temperature of at least about 1850° C., for example at least about 2000° C. to activate the gas mixture to facilitate diamond growth. For example, when the filament is an activated tungsten filament, the filament is heated to about 2100° C. For example, when the filament is a tantalum filament, the filament is heated to about 2600° C.

In embodiments, the gas mixture charged to the CVD growth chamber is electrically activated to facilitate diamond growth, for example to form a plasma in the CVD growth chamber. The gas mixture may be electrically activated by applying an electric current across the gas mixture contained in the CVD growth chamber (e.g. employing DC-CVD or DCP-CVD) or by introducing electromagnetic waves (for example electromagnetic waves having a radio frequency or a microwave frequency) to the CVD growth chamber to activate the gas mixture to facilitate diamond growth.

In certain embodiments, at least a component of the gas mixture (e.g. hydrogen) is charged into the CVD growth chamber such that the pressure within the CVD growth chamber is at least about 5 Torr, for example at least about 10 Torr, or at least about 15 Torr, prior to electrically activating the gas mixture to form a plasma. Following formation of a plasma, the pressure in the CVD growth chamber may be increased (for example up to about 500 Torr or less, for example to a pressure of about 120-300 Torr) by charging the CVD growth chamber with more of the gas mixture, for example other components of the gas mixture (for example, carbon source gas and optionally additional hydrogen gas). For embodiments in which CVD growth is via microwave plasma, the plasma may be formed by applying electromagnetic waves having a frequency of around 2.5 GHz to the gas mixture. Temperatures in the CVD growth chamber may be in the range of about 400-1200° C., for example 700-1000° C., for example 850-950° C.

In the method of the present invention, a period is provided for diamond growth during which the gas mixture is sealed within the CVD growth chamber, that is during a period of diamond growth no gas (other than minor leaks where this is possible) is introduced or removed from the CVD growth chamber. The period of diamond growth may have a duration of at least 1 minute, for example at least 5 mins, at least 10 mins, at least 20 mins, at least 30 mins, at least 40 mins, at least 50 mins or at least 1 hour. The period of diamond growth may have a duration of up to about 7 hours, for example up to about 5 hours, up to about 4 hours, up to about 3 hours, up to about 2 hours, up to about 90 mins or up to about 75 mins. For example, the period of diamond growth may have a duration from about 1 minute to about 2 hours, for example 5 mins to about 90 mins, or about 10 mins to about 75 mins.

In the method of the present invention, a period is provided for diamond growth during which the gas mixture is sealed within the CVD growth chamber. A method/process which provides a period of diamond growth during which the gas mixture is sealed within the CVD growth chamber may be referred to herein as a process/method operating in "static mode". In certain embodiments, during "static-mode" operation there is substantially no flow or no flow of the gas mixture through the CVD chamber for at least a period of diamond growth. In certain embodiments, "substantially no flow" of the gas mixture through the CVD chamber for at least a period of diamond growth is a gas flow of less than about 15 sccm, for example less than about 10 sccm, less than about 5 sccm or less than about 1 sccm.

In embodiments, the process comprises monitoring the composition of the gas mixture in the CVD growth chamber. In embodiments, the composition of the gas mixture in the CVD growth chamber is monitored using a residual gas analyser (RGA) or optical emission spectroscopy (OES).

In embodiments, the process comprises monitoring the pressure in the CVD growth chamber.

In embodiments, the process comprises monitoring the temperature in the CVD growth chamber. In embodiments, the process comprises monitoring the temperature of the growth substrate in the CVD growth chamber.

In embodiments, the process comprises monitoring the composition of the gas mixture in the CVD growth chamber and determining whether the composition of the gas mixture falls outside of a pre-determined growth parameter.

In embodiments, the process comprises ending the period of diamond growth (e.g. by deactivating the gas mixture, for example by turning off the plasma, or by evacuating the gas mixture from the chamber, for example into a gas capture device) in response to a determination that the composition of the gas mixture falls outside of a pre-determined growth parameter.

In embodiments, the process comprises ending the period of diamond growth in response to a determination that the composition of the gas mixture (i.e. the first gas mixture) falls outside of a pre-determined growth parameter, either by evacuating the first gas mixture in the chamber or ending the period of growth or evacuating the chamber subsequent to the period of growth being ended. In embodiments, the process comprises charging the CVD growth chamber with a second gas mixture following evacuation of the first gas mixture. The first and second gas mixtures may have the same or different compositions. In embodiments, the first and second gas mixtures may contain different carbon source gases selected from a carbon source gas which is isotopically pure with respect to $^{12}C$, a carbon source gas comprising an increased $^{13}C$ content compared to the natural isotopic abundance of $^{13}C$, or a carbon source gas comprising an increased $^{14}C$ content compared to the natural isotopic abundance of $^{14}C$. For example, one of the first and second gas mixtures may contain a carbon source gas which is isotopically pure with respect to $^{12}C$ and the other of the first and second gas mixtures may contain a carbon source gas comprising an increased $^{13}C$ content compared to the natural isotopic abundance of $^{13}C$, or an increased $^{14}C$ content compared to the natural isotopic abundance of $^{14}C$. For example, one of the first and second gas mixtures may contain a carbon source gas which contains a carbon source gas comprising an increased $^{13}C$ content compared to the natural isotopic abundance of $^{13}C$, and the other of the first or second source gases may contain an increased $^{14}C$ content compared to the natural isotopic abundance of $^{14}C$. By providing first and second gas mixtures having different compositions a layered diamond structure may be provided.

In embodiments, the process comprises ending the period of diamond growth in response to a determination that the composition of the second gas mixture (e.g. the remaining gas following diamond growth following introduction of the second gas mixture) falls outside of a pre-determined growth parameter, either by evacuating the second gas mixture in the chamber or ending the period of growth or evacuating the chamber subsequent to the period of growth being ended. In embodiments, the process comprises charging the CVD growth chamber with a third gas mixture following evacuation of the second gas mixture. The first, second and third gas mixtures may have the same or different compositions. In embodiments, the first, second and third gas mixtures may contain different carbon source gases selected from a carbon source gas which is isotopically pure with respect to $^{12}C$, a carbon source gas comprising an increased $^{13}C$ content compared to the natural isotopic abundance of $^{13}C$, or a carbon source gas comprising an increased $^{14}C$ content compared to the natural isotopic abundance of $^{14}C$. For example, one of the first, second and third gas mixtures may contain a carbon source gas which is isotopically pure with respect to $^{12}C$, another of the first, second and third gas mixtures may contain a carbon source gas comprising an increased $^{13}C$ content compared to the natural isotopic abundance of $^{13}C$, and the remaining one of the first, second and third gas mixtures may contain an increased $^{14}C$ content compared to the natural isotopic abundance of $^{14}C$. By providing first, second and third gas mixtures having different compositions a layered diamond structure may be provided.

The method described herein may be used to provide an isotopically layered diamond material. For example, the method may comprise providing isotopically distinct gas mixtures (e.g. gas mixtures selected from gas mixtures may containing different carbon source gases selected from a carbon source gas which is isotopically pure with respect to $^{12}C$, a carbon source gas comprising an increased $^{13}C$ content compared to the natural isotopic abundance of $^{13}C$, and a carbon source gas comprising an increased $^{14}C$ content compared to the natural isotopic abundance of $^{14}C$) and employing each of the isotopically distinct gas mixtures to provide distinct periods for diamond growth during which an isotopically distinct layer of diamond is grown (e.g. $^{12}C$ diamond, $^{13}C$ diamond or $^{14}C$ diamond), wherein an isotopically distinct gas mixture is evacuated from the CVD growth chamber prior to introduction of another of the isotopically distinct gas mixtures.

Following evacuation of one gas mixture from the CVD growth chamber and charging the CVD gas chamber with another gas mixture, the process described herein may be repeated, for example repeated multiple times if desirable (for example to form a multi-layered diamond material).

For example, the process may further comprise charging the CVD growth chamber with a second gas mixture following evacuation of the first gas mixture, and activating the second gas mixture to facilitate growth of a second layer of diamond on the growth substrate; and providing for a period of second layer diamond growth during which the second gas mixture is sealed within the CVD growth chamber. Furthermore, the process may further comprise evacuating the second gas mixture from the CVD growth chamber, charging the CVD growth chamber with a third gas mixture following evacuation of the second gas mixture, activating the third gas mixture to facilitate growth of a third layer of diamond on the growth substrate; and providing for a period of third layer diamond growth during which the third gas mixture is sealed within the CVD growth chamber In embodiments, the or each gas mixture comprises a pre-mixed gas composition, for example a pre-mixed gas composition comprising from about 1 vol. % to about 10 vol. % carbon source gas (e.g. methane) by total volume of the gas mixture; and from about 90 vol. % to about 99 vol. % hydrogen source gas (e.g. hydrogen gas) by total volume of the gas mixture.

In embodiments, the or each gas mixture is formed in the CVD growth chamber by introducing each component of the gas mixture, for example a carbon source gas and a hydrogen source gas into the CVD growth chamber. In embodiments, a hydrogen source gas is introduced into the CVD growth chamber prior to the carbon source gas to form a gas mixture in the CVD growth chamber. In embodiments where the gas mixture is electrically activated, for example activated via a microwave or other plasma, the plasma may be struck when the CVD growth chamber contains only a hydrogen gas, however subsequent introduction of the carbon source gas then results in electrical activation of the gas mixture including the carbon source gas.

In embodiments, the process comprises adding a further pre-defined amount of a carbon source gas to the CVD growth chamber in response to a determination that the composition of the gas mixture falls outside of a pre-determined growth parameter.

The term "pre-determined growth parameter" is used to refer to conditions within the CVD growth chamber which may affect diamond growth, such as the amount of carbon source gas present in the CVD growth chamber, the concentration of methyl radicals in the CVD growth chamber, or the concentration of $C_2^*$ in the CVD growth chamber.

In embodiments, the process comprises ending the period of diamond growth in response to a determination that the amount of carbon source gas present in the CVD growth chamber falls outside of a pre-determined growth parameter. In embodiments, the process comprises ending the period of diamond growth in response to a determination that the concentration of methyl radicals in the CVD growth chamber falls outside of a pre-determined growth parameter. In embodiments, the process comprises ending the period of diamond growth in response to a determination that the concentration of $C_2^*$ in the CVD growth chamber falls outside of a pre-determined growth parameter.

In embodiments, the process comprises adding a further pre-defined amount of a carbon source gas to the CVD growth chamber in response to a determination that the carbon source gas present in the CVD growth chamber falls outside of a pre-determined growth parameter. In embodiments, the process comprises adding a further pre-defined amount of a carbon source gas to the CVD growth chamber in response to a determination that the concentration of methyl radicals in the CVD growth chamber falls outside of a pre-determined growth parameter. In embodiments, the process comprises adding a further pre-defined amount of a carbon source gas to the CVD growth chamber in response to a determination that the concentration of $C_2^*$ in the CVD growth chamber falls outside of a pre-determined growth parameter.

In embodiments, the pre-determined growth parameter is that the concentration of methyl radicals is at least 50% of the maximum concentration of methyl radicals present in the CVD growth chamber (the maximum concentration of methyl radicals is present immediately after the activated gas mixture containing a pre-defined amount of the carbon source gas attains a stable operating condition and electron temperature, e.g. immediately after the gas mixture plasma (the gas mixture plasma formed on activation of the gas mixture) attains a stable operating condition and electron temperature), for example at least 40% of the maximum concentration of methyl radicals, at least 30% of the maximum concentration of methyl radicals, at least 20% of the maximum concentration of methyl radicals, or at least 10% of the maximum concentration of methyl radicals. For example, when the pre-determined growth parameter is that the concentration of methyl radicals is at least 10% of the maximum concentration of methyl radicals, additional carbon source gas may be introduced to the CVD growth chamber when the concentration of methyl radicals in the CVD growth chamber falls below 10% of the maximum concentration of methyl radicals, or the period of diamond growth may be ended when the concentration of methyl radicals in the CVD growth chamber falls below 10% of the maximum concentration of methyl radicals.

In embodiments, the pre-determined growth parameter is that the concentration of $C_2^*$ is at least 50% of the maximum concentration of $C_2^*$, i.e. at least 50% of the highest concentration of $C_2^*$ present in the CVD growth chamber (the maximum concentration of $C_2^*$ is present immediately after the activated gas mixture containing a pre-defined amount of the carbon source gas attains a stable operating condition and electron temperature, e.g. immediately after the gas mixture plasma (the gas mixture plasma formed on activation of the gas mixture) attains a stable operating condition and electron temperature), for example at least 40% of the maximum concentration of $C_2^*$, at least 30% of the maximum concentration of $C_2^*$, at least 20% of the maximum concentration of $C_2^*$, or at least 10% of the maximum concentration of $C_2^*$. For example, when the pre-determined growth parameter is that the concentration of $C_2^*$ is at least 10% of the maximum concentration of $C_2^*$, additional carbon source gas may be introduced to the CVD growth chamber when the concentration of $C_2^*$ in the CVD growth chamber falls below 10% of the maximum concentration of $C_2^*$ radicals, or the period of diamond growth may be ended when the concentration of $C_2^*$ in the CVD growth chamber falls below 10% of the maximum concentration of $C_2^*$ radicals.

FIG. 1 shows a schematic diagram of a CVD apparatus comprising a CVD reaction chamber 1. The CVD reaction chamber comprises a growth substrate 2, a gas inlet 5 and a gas outlet 4. A gas mixture may be supplied to the CVD growth chamber from a gas cylinder(s) 6a, 6b, 6c. The gas mixture may be a pre-mixed gas mixture or the gas mixture may be supplied to the CVD growth chamber 1 from different gas cylinders containing different components of the gas mixture. The flow of a gas from a gas cylinder may be controlled by a regulator 7, and/or by a valve 13 in fluid communication with the gas inlet 5. A gas mixture may be evacuated from the CVD growth chamber via gas outlet 4 by opening a valve 8 and optionally applying a vacuum by using a gas pumping device 9. Gas evacuated from the CVD growth chamber may be either captured by a gas capture device 12, for example by opening gas capture valve 10 to prevent escape of gas to the atmosphere, or released to the atmosphere, for example by opening an atmosphere release valve 11.

During periods of diamond growth valves (8 and 13) in the gas inlet 5 and the gas outlet 4 may be closed to prevent gas from escaping from the CVD growth chamber, for example such that the CVD growth chamber is hermetically sealed.

The CVD apparatus may comprise a gas composition monitoring device 14. For example the CVD apparatus may comprise a viewport 3 through which the gas mixture in the CVD chamber may be analysed using optical emission spectrometer as the gas composition monitoring device 14, or the gas composition monitoring device 14 may be a residual gas analyser (RGA).

Unless otherwise stated, any feature described herein can be combined with any aspect or any other feature described herein.

Examples

The following illustrates examples of the methods and related aspects described herein. Thus, these examples should not be considered to restrict the present disclosure but are merely in place to teach how to carry out the methods of the present disclosure.

In these Examples it is demonstrated that diamond is successfully produced by CVD from a MW activated sealed C/H gas mixture. The demonstration involves comparison with diamond samples grown using the same MW reactor working in the standard "flow-mode" (i.e. CVD with a flowing gas mixture, and residence times about 2 min, representing a conventional CVD process to produce diamond). In addition to material comparisons based on Raman Spectroscopy and Scanning Electron Microscopy (SEM) measurements, Optical Emission Spectroscopy (OES) was also employed to track emitting $C_2$ and CH species during growth from both the "static-mode" and "flow-mode" C/H plasmas. Prior studies have demonstrated that the $C_2$(d—a) emission intensity from the hot plasma core region is a good proxy for the local C content in that region (Su 2017, Ma 2009 and Mahoney 2017), while the CH(A—X) emission intensity is the better signifier of the concentrations of the $CH_x$ ($0 \leq x \leq 3$) species implicated in diamond growth.

Diamond was grown by microwave plasma chemical vapor deposition (MWCVD) under "static-mode" operation (as defined herein) and, for comparison, using a "flow-mode" operation (wherein "flow-mode" represents conventional diamond growth by CVD).

Prior to diamond growth, 10 mm² silicon substrates of thickness 0.5 mm ([100]; p-type; Pi-KEM, UK), were seeded by submerging the substrates first in a carboxyethyl silanetriol di-sodium solution (25% in water, available from Fluorochem Ltd.) and then a suspension of sonicated 18 nm nano-diamond particles (25 cts/kg, available from Microdiamond AG), as described by Croot 2017.

Diamond growth was performed on the seeded silicon substrates using microwave plasma-enhanced CVD (MWCVD) in a 1.5 kW ASTeX type reactor, the reactor configured as described by Croot 2017. The volume of the cylinder reactor body was about 600 cm³. However, the total volume of the reactor during operation in "static-mode" was determined to be about 2.5 L (estimated by a pressure-rise test using a calibrated $H_2$ mass flow controller). The total reactor volume takes into account the total volume of the reactor which is available to gaseous reactants, including a manifold leading to an exit valve of the reactor (the exit valve of the reactor being closed during "static-mode" operation).

An optical emission spectrograph (in these Examples the optical emission spectrograph used was a Czerny-Turner spectrograph (Shamrock SR-303i-A, Andor, UK) equipped with a 500 mm focal length, f/5.6 objective lens) was coupled to the reactor described above to allow optical emission spectra from the plasma to be monitored during diamond growth in order that the composition of the gas mixture be monitored.

Before the diamond growth was carried out as described in Example 1 and Comparative Example 2 below, the seeded silicon substrate was positioned axially symmetrically on a tungsten disk (1.25" diameter, 3 mm thick) which was separated from the water-cooled aluminium base-plate of the reactor by an annular molybdenum wire spacer with user-selectable diameter in the range 0.002" $\leq d_{wire} \leq$ 0.006". Varying the spacer wire diameter enabled some variation of the substrate temperature, $T_{sub}$, while causing minimal change to the plasma parameters.

Example 1- "Static-mode" operation

750 W of (2.45 GHz) MW power was supplied to the growth chamber of the reactor to provide a static-mode plasma, during which the reactor was maintained at a pressure p=15 Torr of pure $H_2$ (99.99999% purity). The valve in the pumping line was then shut, simultaneously with the opening of $CH_4$ and $H_2$ (6% mixing ratio) flows (gas flow rates, $F(H_2)$=300 standard cm³ (sccm) and $F(CH_4)$=19 sccm), thereby ensuring that no methane was lost before deposition conditions were reached. Once the pressure of the growth chamber reached p=150 Torr, the $CH_4$ and $H_2$ gas flows were switched off. As the pressure in the CVD growth chamber was increased, the 2.45 GHz MW power supplied to the growth chamber was also increased to 1.5 kW. This point (when pressure=150 Torr and MW power of 1.5 kW) was taken as t=0 when defining growth times in static-mode operation. Given that the plasma ignition pressure was 10% of the eventual deposition pressure, the initial input methane mole fraction for the "static mode" operation runs was 5.4%.

Comparative Example 2-"Flow-mode" operation

In standard flow-mode operation, 750 W of (2.45 GHz) MW power was supplied to the reactor chamber maintained at a pressure p=15 Torr of hydrogen (99.99999% purity; generated by electrolyzing (Milli-Q purified) water; Noble-gen MicroPROGEL, UK) and methane (99.9995% purity; Air-Liquide, UK). Pressure and MW power was then increased as described in Example 1 above. Unlike example 1, gas flows were not switched off. Gas flow rates, $F(H_2)$=300 standard cm³ (sccm) and $F(CH_4)$=19 sccm resulted in a process gas mixture of 6% methane in hydrogen. For diamond growth under "flow mode" operation, t=0 was the point at which the pressure in the CVD chamber reached 150 Torr and the MW power was 1.5 kW, at this point the plasma was stable and the gas mixture was flowing through the chamber over the seeded silicon substrate at a pressure of 150 Torr.

Both static-mode and flow-mode operations were run to a maximum time of t=90 min.

A total of six static-mode growth experiments as described in Example 1 above were carried out, four of which investigated the effect of $T_{sub}$ (using different spacer wire thicknesses to yield $T_{sub}$ of about 765, 830, 890 and 950° C., where $T_{sub}$ refers to the temperature of the seeded substrate) for a growth time t=90 min. The other two were shorter growth runs performed at $T_{sub}$~890° C., for t=30 and 60 min respectively. When combined with the $T_{sub}$~890° C., t=90 min experiment, these allowed investigation of how the growth rate evolved with time at a common $T_{sub}$. The reactor leak rate was measured prior to each growth experiment by evacuating the reactor, closing the valve to the pump and monitoring the pressure rise over a 60 min period.

Optical emission spectra from the plasma was monitored during diamond growth under both static- and flow-mode operations. The intensities of the $C_2(d^3\Pi_g - a^3\Pi_u)\Delta v=0$ and $CH(A^2\Delta - X^2\Pi)\Delta v=0$ emissions, henceforth referred to as $/(C_2^*)$ and $/(CH^*)$ respectively, were imaged using the Czerny-Turner spectrograph (Shamrock SR-303i-A, Andor, UK) equipped with a 500 mm focal length, f/5.6 objective lens. After passing through an about 10 μm vertical slit the emissions are dispersed by a 1200 grooves per mm diffraction grating, yielding a spectral resolution of about 0.09 nm (full width at half maximum, FWHM) when imaged by a cooled CCD detector (Newton DU970P-BV, Andor, UK).

Figure 2:
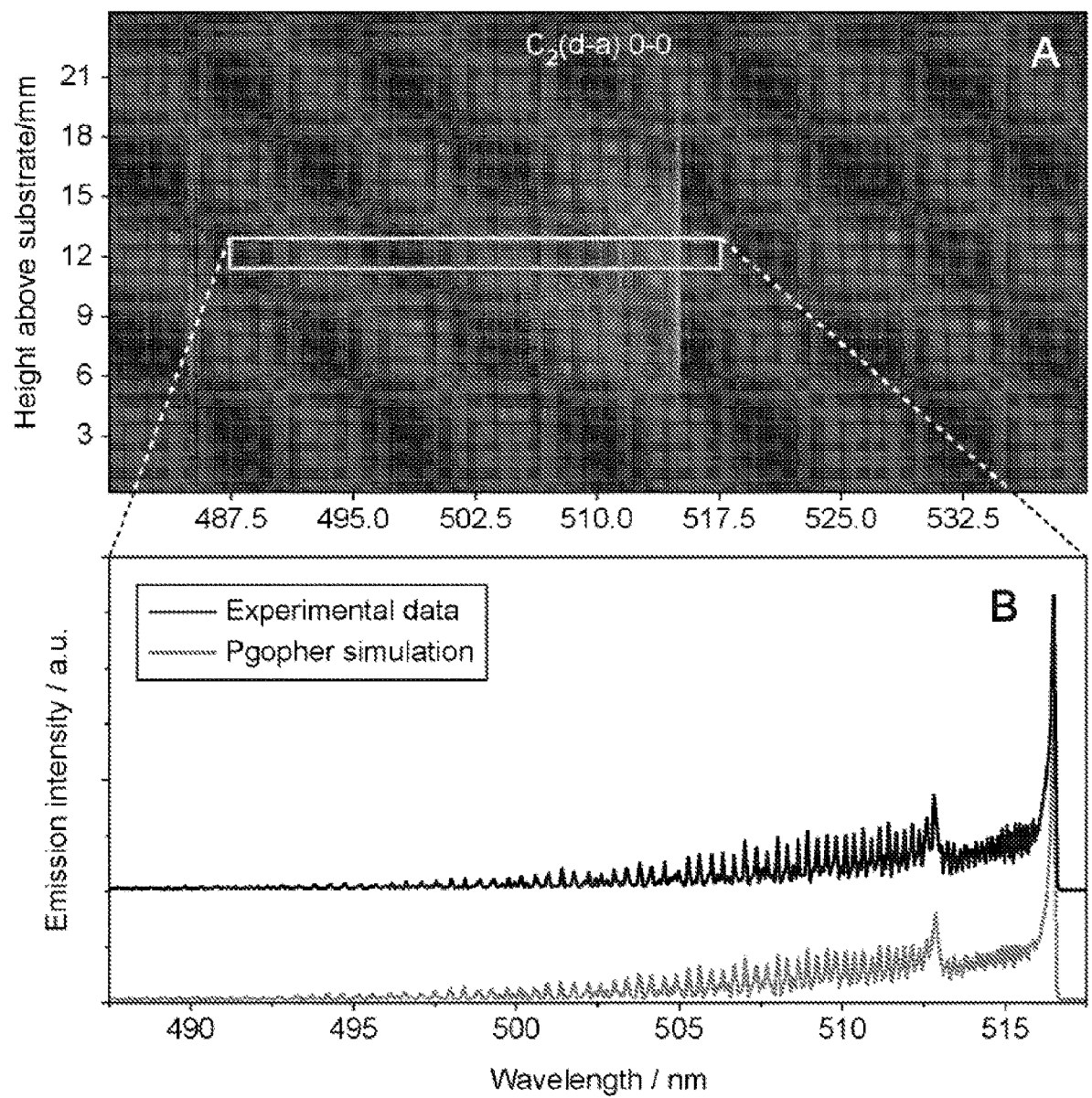
FIG. 2A is a spatially and spectrally resolved image of optical emission in the wavelength region that includes the $C_2$(d—a) $\Delta v=0$ system and the H-Balmer $\beta$ line at 486 nm.
FIG. 2B shows a spectrum of intensity versus wavelength for emission from the region z=12±0.75 mm above the substrate surface (indicated by the rectangle shown in FIG. 2A), along with a PGOPHER simulation (Western 2016)

The emission intensities, $/(C_2^*)$ and $/(CH^*)$, were monitored during each growth experiment. FIG. 2 shows a sample image of the $C_2(d-a)\Delta v=0$ system. FIG. 2A shows a spatially and spectrally resolved image of optical emission in the wavelength region that includes the $C_2(d-a)$ $\Delta v=0$ system and the H-Balmer β line at 486 nm. FIG. 2B shows a spectrum of intensity versus wavelength for emission from the region z=12±0.75 mm above the substrate surface (indicated by the rectangle shown in FIG. 2A), along with the PGOPHER simulation. The upper line shown in FIG. 2B shows the experimental data, with the lower line showing the PGOPHER simulation. Data was extracted and processed using the PGOPHER software package as described by Western 2016 to simulate and integrate the entire emission intensity in each spectrum (or just the emission intensity at a chosen range of heights z above the substrate), with proper consideration of $T_{gas}$ (temperature of the gas mixture) and the spectral resolution, in order to provide a relative emission $/(C_2^*)$ (or $/(CH^*)$) intensity at any time within each deposition run. The emitting states are generated by electron impact excitation of the corresponding ground state species (in the case of CH or, in the case of $C_2$, of radicals in the low lying $a^3\Pi_u$ state). The measured OES intensities are thus sensitive to the product of the local concentrations of the lower state species of interest and of suitably energetic electrons (Ashfold 2017 and Ma 2009). The electron energy distribution function at any given location within the reactor is assumed to be essentially constant during any particular growth run. Thus the (relative) OES intensity gives a reliable measure of the relevant species concentration and its evolution within (and between) experiments and normalizing to the highest intensity in any static-mode dataset, generally at t=0 min, allows easy comparison between deposition experiments.

For comparison purposes, two depositions were also carried out starting from the flow-mode conditions described above, with $F(CH_4)=19$ and 17 sccm respectively and $T_{sub}$~885° C. $F(CH_4)$ was decreased manually in a stepwise fashion (specified later) during the full 90 min growth period, so as to mimic the declining gas phase carbon content (estimated via the $/(C_2^*)$ signal from the hot plasma core) during static-mode growth.

The diamond samples grown in each of the growth experiments were analyzed first by Raman spectroscopy (2000 series, Renishaw, UK) using a 514.5 nm Ar ion laser (Excelsior series, Spectra-Physics, UK), and then by SEM (Sigma, Zeiss, Germany), which required sputter deposition of a thin (~20 nm) gold layer to mitigate charging effects. The combination of Raman spectroscopy and SEM yields film quality and thickness information. The latter was measured at a range of points across each in a set of 4 cross-sectional images, the locations of which on the film surface form a square of side length 4 mm, centred at the middle of the sample. Two linear cleaves, 4 mm apart (i.e., 3 mm from the sample edge), were required to expose these points for examination.

Figure 3:
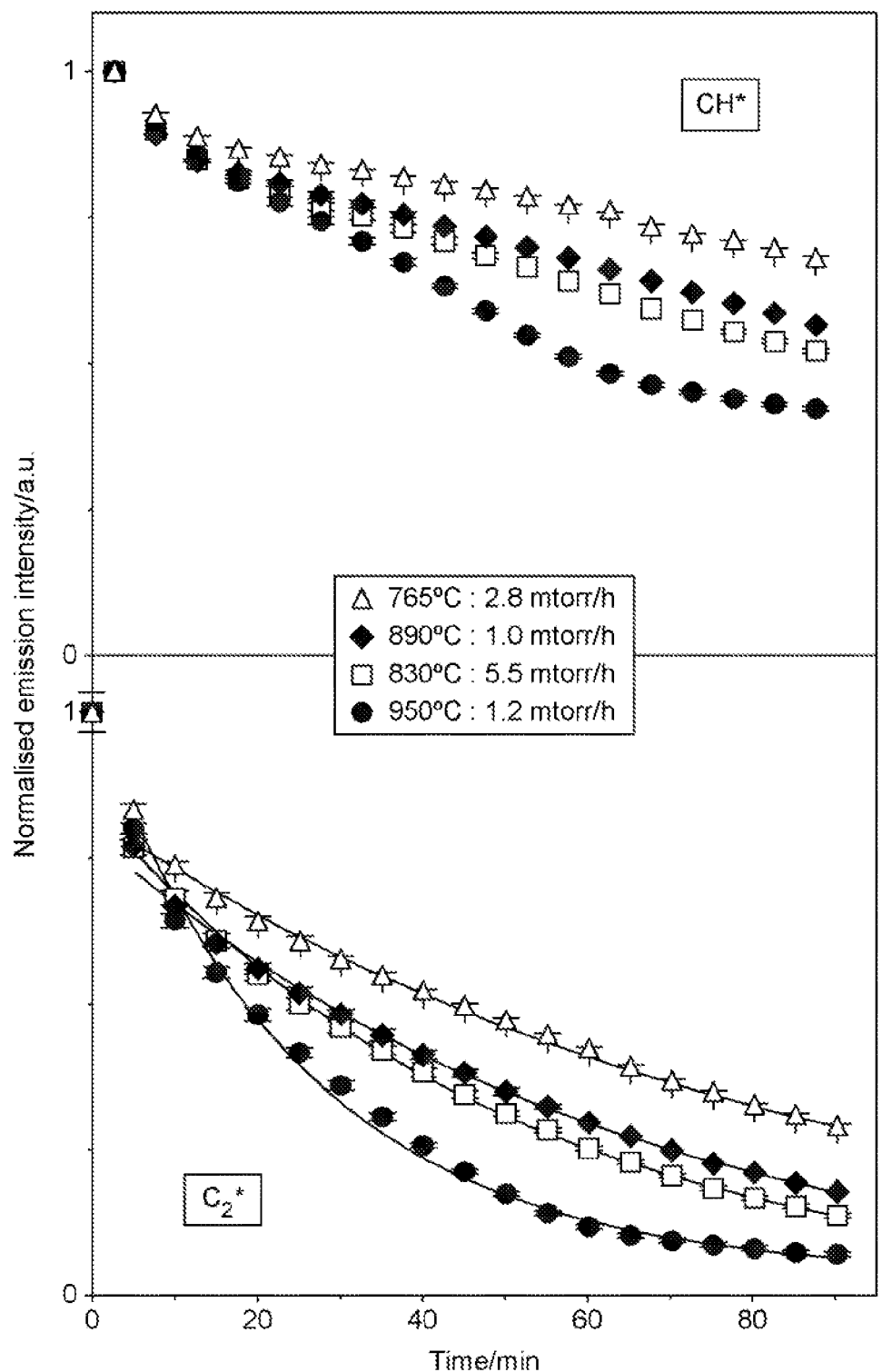
FIG. 3 shows /(CH*) and /($C_2$*) emission intensities measured as a function of time during static-mode growth as described in Example 1 at four different substrate temperatures (shown in the legend, along with the reactor leak rate measured immediately prior to that particular growth run). The solid lines in the lower panel are fitted exponential decays from the second (t=3 min) data point onwards, by which time the plasma is considered to have reached quasi-steady state.

Time-dependent optical emission intensities of $C_2^*$ and $CH^*$ in static-mode FIG. 3 shows $/(CH^*)$ and $/(C_2^*)$ emission intensities measured as a function of time during static-mode growth as described in Example 1 at four different substrate temperatures (shown in the legend, along with the reactor leak rate measured immediately prior to that particular growth run). The solid lines in the lower panel are fitted exponential decays from the second (t=3 min) data point onwards, by which time the plasma is considered to have reached quasi-steady state. As FIG. 3 shows, $/(C_2^*; z~12 mm)$ and $/(CH^*; z~12 mm)$ both decline during the entire 90 min static-mode growth experiments, at rates that increase with increasing $T_{sub}$. Analysis of these emission data at other z show very similar trends: The intensity $/(C_2^*)$ declines exponentially, with a time constant t that scales inversely with $T_{sub}$. While the intensity $/(CH^*)$ drops less steeply and, even at the highest $T_{sub}$ investigated, has only declined to about 40% of its initial value by t=90 min. These differences are reminiscent of the results of previous flow-mode studies of the ways in which the $C_2$ and CH concentrations in the plasma vary with changes in $F(CH_4)$ (see Ma 2009). This finding suggests that $/(C_2^*)$ remains a good proxy for the total C content in the plasma region under static-mode conditions and that we might expect a correlation between the rate of fall of $/(C_2^*)$ and the material deposition rate.

Combined material thickness and plasma measurements for static-mode growth

Figure 4:
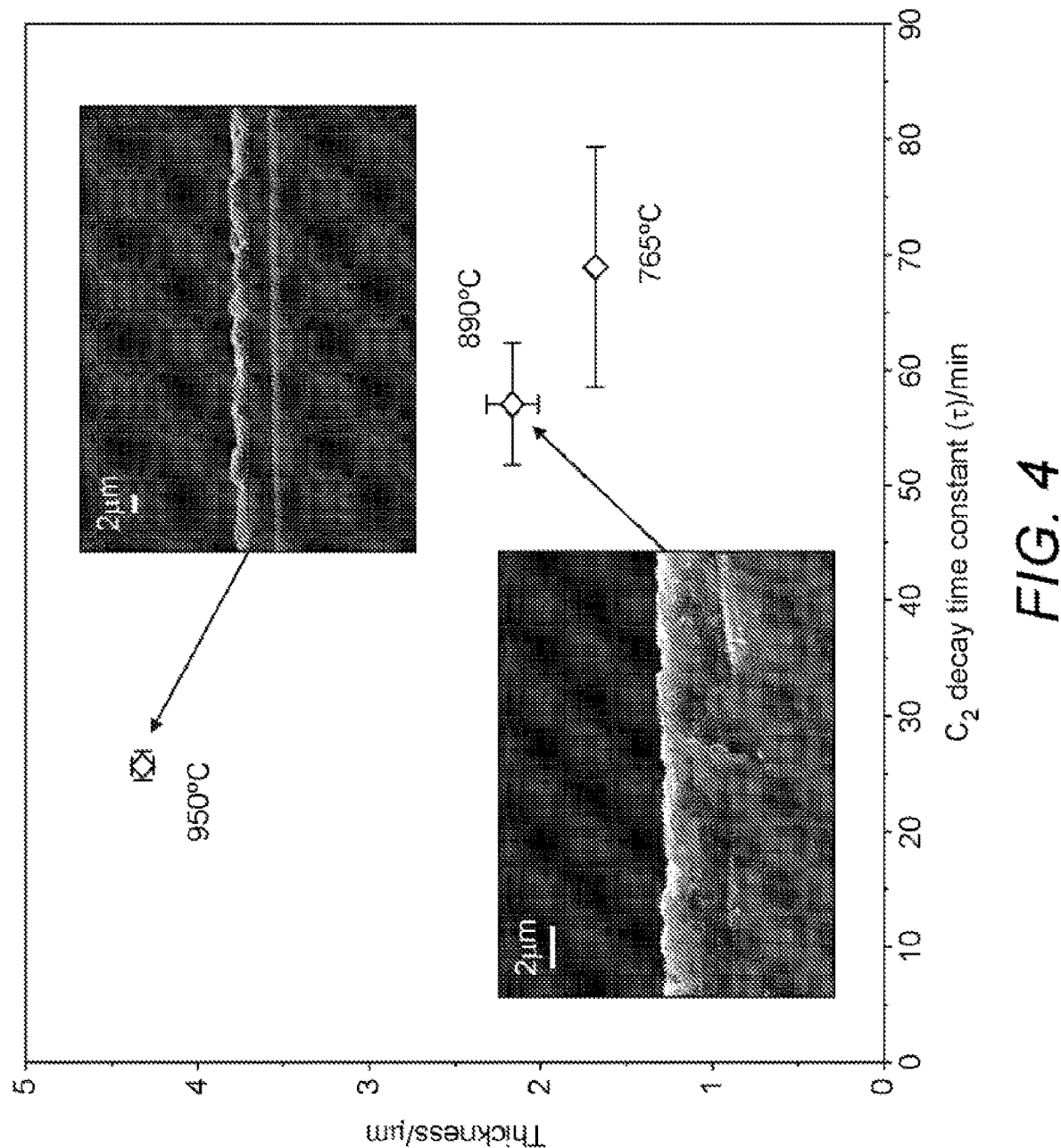
FIG. 4 shows a plot of deposited film thickness following static-mode deposition for t=90 min against the decay constant of the /($C_2$*) emission. Representative cross section SEM images of the samples grown at $T_{sub}$=890 and 950° C. are shown in the insets and the bars on the data points represent the standard error.

FIG. 4 shows a plot of deposited film thickness following static-mode deposition for t=90 min against the decay constant of the $/(C_2^*)$ emission. Representative cross section SEM images of the samples grown at $T_{sub}$=890 and 950° C. are shown in the insets and the bars on the data points represent the standard error.

The correlation between the $/(C_2^*)$ and the deposition rate is confirmed by FIG. 4, which compares the deposited material thickness after growth for t=90 min (as determined by cross-sectional SEM) with the corresponding $/(C_2^*; z~12 mm)$ decay constant for three different growth temperatures. The SEM images shown in the insets to this figure show the facetted morphology expected of polycrystalline diamond, the quality of which is assessed below. As noted previously, the relatively small changes in $T_{sub}$ are expected to have minimal influence on the plasma processing and plasma parameters in the plasma core but will influence the gas-surface chemistry required for growth and thus the rate of loss of carbon from the plasma to the substrate. The measured trends suggest that deposition on the substrate is a significant sink for gas phase C under static-mode conditions.

Figure 5:
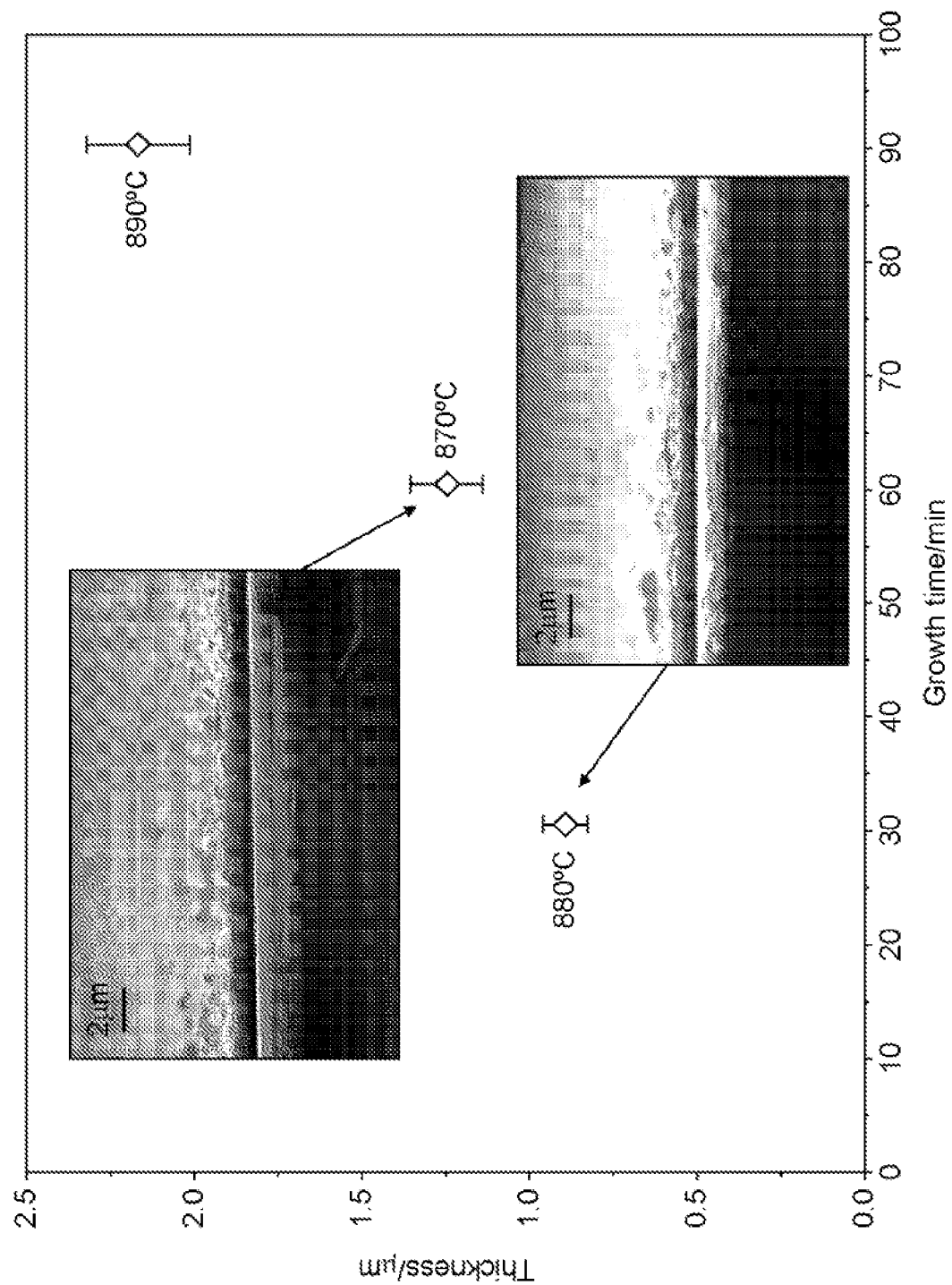
FIG. 5 is a plot showing diamond thickness as a function of deposition time for three samples grown at very similar substrate temperatures, $T_{sub}$. Representative cross section SEM images of the t=30 and 60 min samples are shown in the insets and the bars on the data points represent the standard error.

FIG. 5 is a plot showing diamond thickness as a function of deposition time for three samples grown at very similar deposition temperatures, $T_{sub}$. Representative cross section SEM images of the t=30- and 60-min samples are shown in the insets and the bars on the data points represent the standard error. FIG. 5 shows how the thickness of diamond samples grown under static-mode conditions at similar $T_{sub}$ values (about 880° C.) and with similar reactor leak rates (low, about 1 mtorr/h) scales with deposition time. These data reveal a relatively constant growth rate throughout the whole t=90 min, notwithstanding the inevitable decline in the C content of the plasma. As FIG. 3 showed, at $T_{sub}$~880° C., /($C_2$*) in the plasma core has dropped to about 30% of its initial value by t=60 min. The small variations in $T_{sub}$ between these three experiments may have a minor influence on the thickness comparison, but the fact that the growth rate appears undiminished at later times serves to remind us of the complexity of the gas phase and gas-surface chemistry that drives diamond CVD. The rates of the gas phase coupling reactions between $C_2H_y$ (0≤y≤6) and $CH_x$(0≤x≤6) species, and thus the absolute concentrations of these various species, depend on many factors including the local C/H ratio, $T_{gas}$ and therefore the location within the reactor volume. One key factor in diamond CVD is the concentration of $CH_x$ species in the immediate vicinity of the substrate. As FIG. 3 shows, /(CH*; z ~12 mm) declines more slowly than /($C_2$*; z ~12 mm). Prior plasma chemistry modelling (of flow-mode conditions) shows (see Truscott 2016, Richley 2012 and Ma 2009) that this trend extends to small z, where it has been shown that the addition reactions involving $CH_x$ species (particularly $CH_3$ radicals) are important in diamond growth (see Cheesman 2008). Thus, it is unsurprising that growth continued at later times but, clearly, growth must cease when the reservoir of gas phase carbon is fully depleted.

Raman spectroscopy of the deposited material

Figure 6:
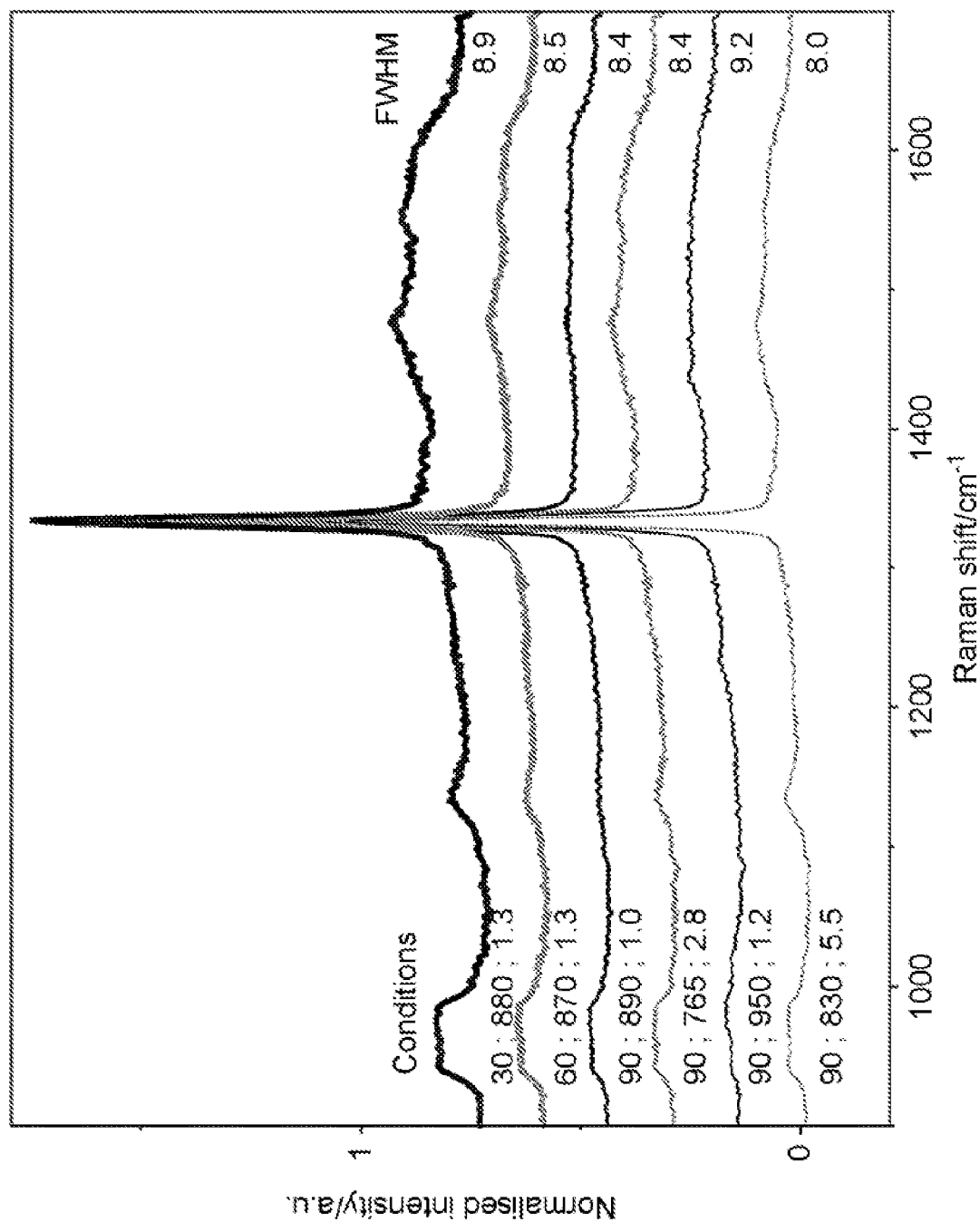
FIG. 6 shows Raman spectra for the various diamond samples deposited under static-mode conditions according to the invention.

FIG. 6 shows Raman spectra for the various samples deposited under static-mode conditions. The intensities are normalized to the height of the 1332 $cm^1$ diamond peak and a rigid shift of 0.15 a.u. has been applied to the intensity axis to separate the spectra. The labelling of each spectrum takes the form: {deposition time/min};{deposition temperature/° C.}; {leak rate/mtorr $h^{-1}$} at the left and {FWHM of the 1332 $cm^{-1}$ peak/$cm^{-1}$} at the right.

Raman spectroscopy (λ=514.5 nm excitation) was used to confirm the presence and quality of the as-grown diamond samples. As FIG. 6 shows, the Raman spectra measured from all of the static-mode deposited samples are dominated by the 1332 $cm^{-1}sp^3$ carbon peak and are characteristic of polycrystalline diamond. Since the deposits are polycrystalline, each sample has some inherent $sp^2$ carbon in the grain boundaries — which is revealed by the features at ~1140 $cm^{-1}$ and in the 1400-1650 $cm^{-1}$ region. These $sp^2$ features are more prominent in the spectra of films grown for shorter time durations and in films grown at lower $T_{sub}$ (about 765° C.), where the grain size is clearly smaller. The Raman spectrum of the sample grown with a higher reactor leak rate ($T_{sub}$ about 830° C.; 5.5 mtorr $h^{-1}$) also shows a higher graphitic carbon content — consistent with an enhanced re-nucleation rate in the presence of $N_2$ (see, Jin 1994 Achard 2007, and Butler). Each of the foregoing observations mimic trends found with standard flow-mode diamond CVD, implying there are few fundamental differences between flow- and static-mode growth.

Comparing growth under static- and flow-mode conditions

A further understanding of the static-mode deposition needs, direct comparisons to be made with material grown by standard flow-mode methods. Therefore, additional flow-mode experiments were conducted, at $T_{sub}$ about 890° C., which sought to mimic the time-evolving plasma composition prevailing in the static-mode growth experiments. This was achieved by progressively reducing F($CH_4$) from a set starting point (F($CH_4$)$_{init}$) to match the carbon content in the plasma core (as revealed by /($C_2$*)) over a 90 min period. The F($CH_4$) profile used is shown in the inset to FIG. 7, which also shows the /($C_2$*) vs t profiles measured for two different initial $CH_4/H_2$ mixing ratios, with F($CH_4$)$_{init}$ corresponding to 6% (Flow A) and 5.4% (Flow B) of the total input.

Figure 7:
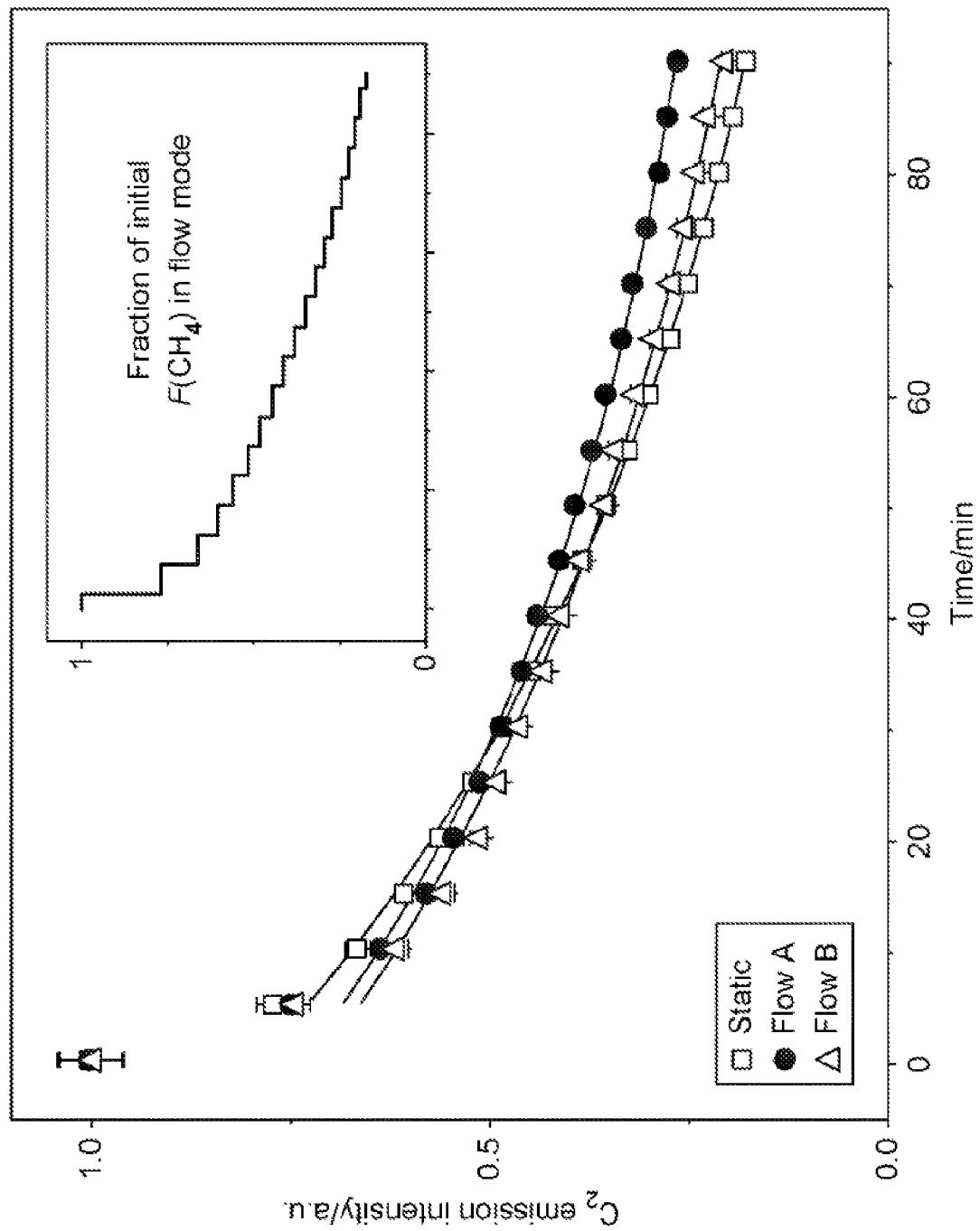
FIG. 7 shows /($C_2$*; z ~12 mm) emission intensities measured as a function of time during two tracked flow-mode runs (circles and triangles) compared with that for a static-mode run (squares) at the same $T_{sub}$(~890° C.)

FIG. 7 shows /($C_2$*; z ~12 mm) emission intensities measured as a function of time during two tracked flow-mode runs (circles and triangles) compared with that for a static-mode run (squares) at the same $T_{sub}$ (~890° C.). F($CH_4$) was adjusted every 5 minutes in the tracked flow-mode experiments to reduce the carbon content in the plasma core (as revealed by the /($C_2$*) signal) to match that in the static-mode experiment. The initial $CH_4$ input mole fractions for the tracked flow-mode experiments were, respectively, 6% (Flow A) and 5.4% (Flow B) and the F($CH_4$) profile employed over the same time period is shown in the inset.

As FIG. 7 shows, the /($C_2$*) vs t profiles obtained with this tracked flow-mode procedure match well with that measured for static-mode growth at the same $T_{sub}$.

Therefore, OES confirms the similarity of the plasmas prevailing in static- and tracked flow-mode operation providing that, in the latter case, F($CH_4$) has the appropriate time dependence. Surprisingly, FIG. 7 shows that the amount of $C^{2*}$(indicative of the concentration of methyl radicals) in the CVD growth chamber in static-mode does not decrease anywhere near as quickly as was previously thought.

Figure 8:
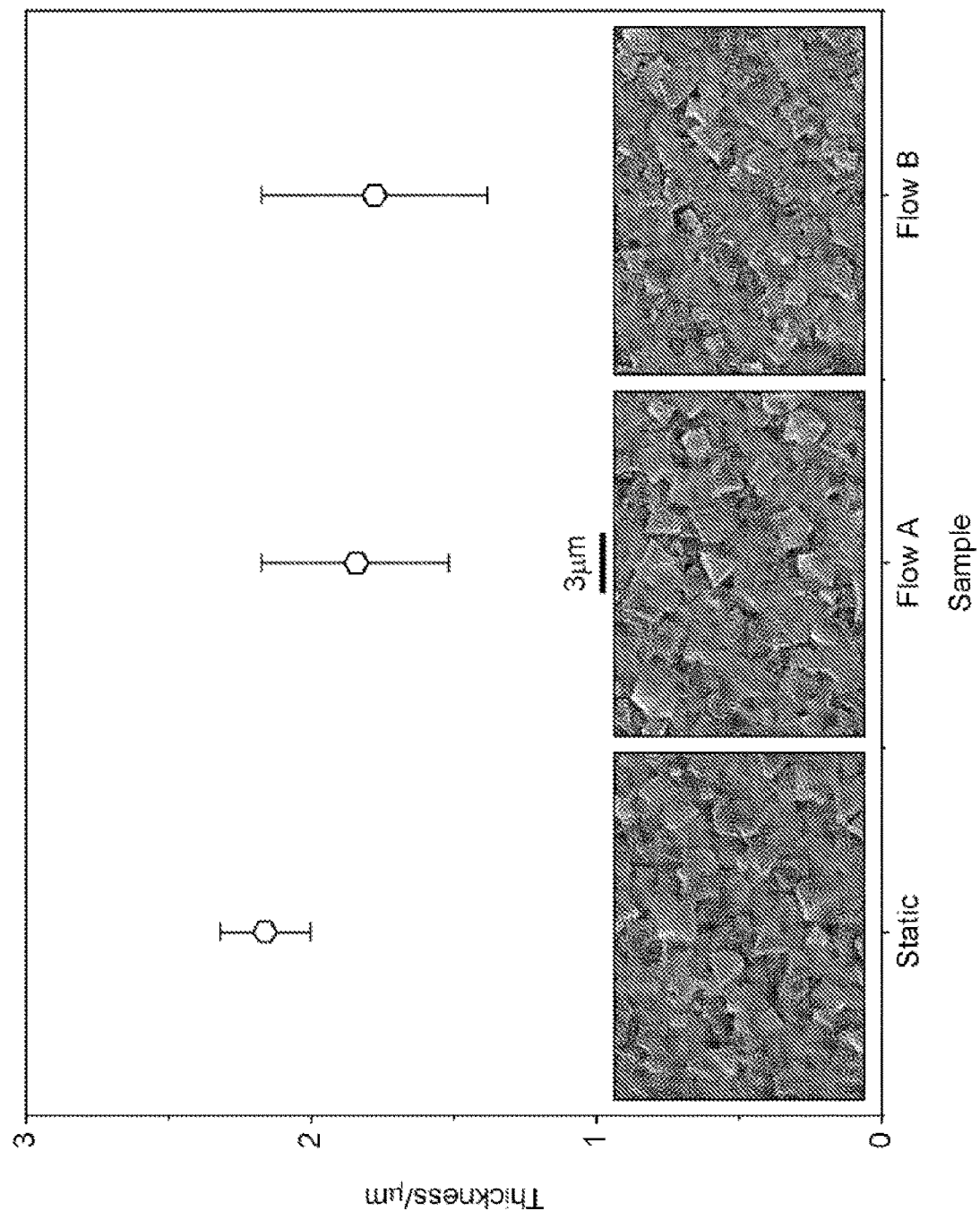
FIG. 8 shows the thicknesses of diamond films grown under static-mode operation of the invention and comparatively under tracked flow-mode operation along with plan view SEM images of the respective samples (insets)

FIG. 8 shows the thicknesses of diamond films grown by static- and tracked flow-mode operation along with plan view SEM images of the respective samples (insets). As FIG. 8 shows, the deposited films also show strong similarities. All are polycrystalline, with facetted surfaces and there are no clear morphological differences between the samples grown under static- and tracked flow-mode conditions. The film grown under static-mode conditions is marginally thicker — possibly reflecting the slightly greater time-averaged nitrogen contamination (from the small reactor leak) under these conditions. Thus, from the perspectives of growth rate and material morphology also, there is little to indicate that low leak-rate, static-mode deposition is fundamentally inferior to flow-mode deposition under similar process conditions.

Figure 9:
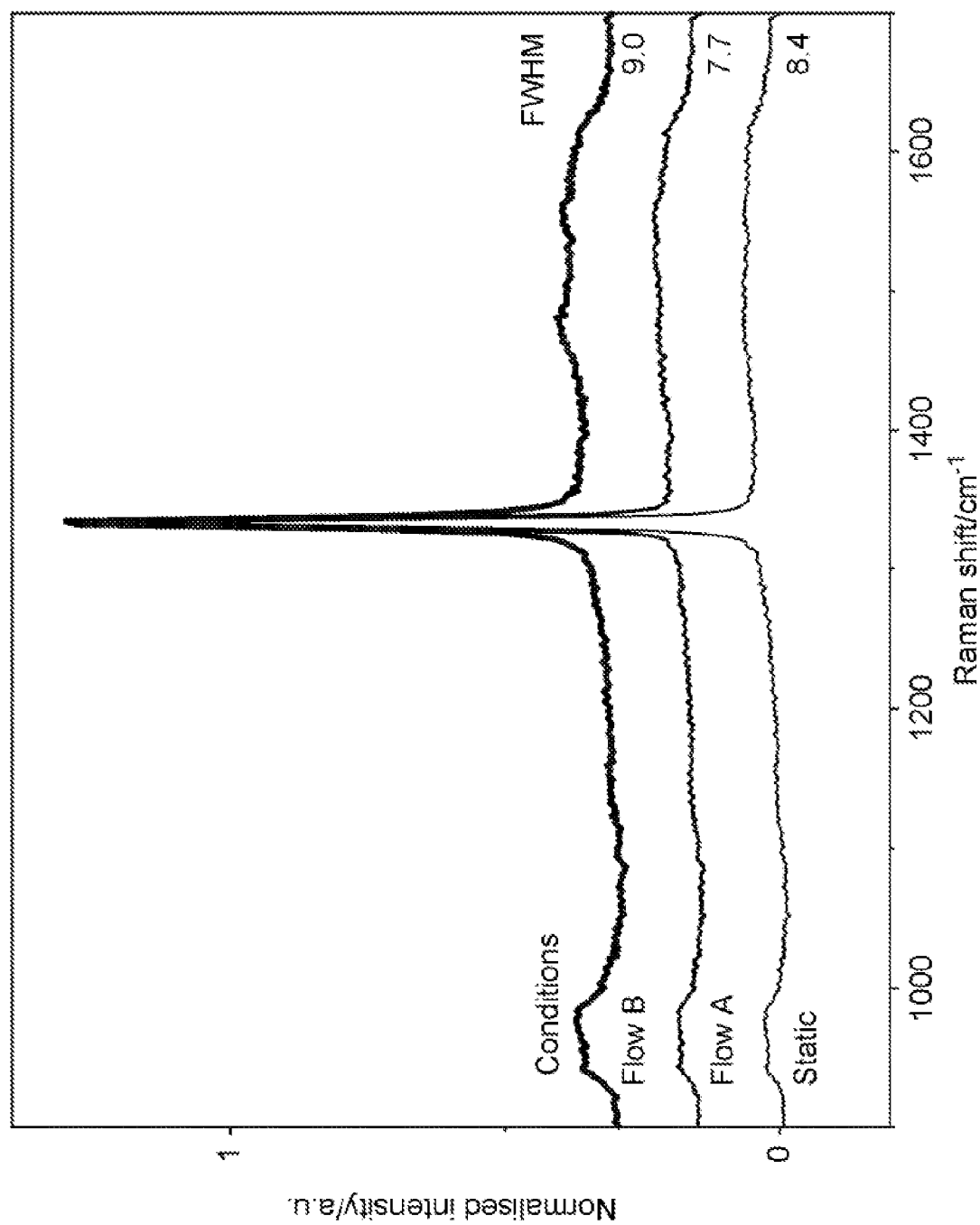
FIG. 9 shows Raman spectra of samples grown under comparative tracked flow-mode conditions (Flow A and B) and static-mode conditions as an Example of the invention.

This conclusion extends to the material quality also, as evidenced by the Raman spectra of the static- and tracked flow-mode samples shown in FIG. 9. FIG. 9 shows Raman spectra of samples grown using tracked flow-mode (Flow A and B) and static-mode conditions. The intensities are normalized to the height of the 1332 $cm^{-1}$ diamond peak and a rigid shift of 0.15 a.u. has been applied to the intensity axis to separate the spectra. The respective FWHM values (in $cm^{-1}$) of the 1332 $cm^{-1}$ peak are shown at the right. The Raman spectra shown in FIG. 9 reveal comparable $sp^3$ and $sp^2$ carbon ratios and very similar FWHM values for the strong 1332 $cm^{-1}$ feature. Careful inspection of the SEM images in FIG. 8 shows that the Flow B sample has a slightly smaller average grain size and the associated increase in surface grain boundary density probably accounts for the increased showing of the $sp^2$ carbon features in the Flow B spectrum. Thus, from the material quality perspective (as revealed by Raman spectroscopy) also, there appears to be little to discriminate between appropriately designed static- and flow-mode deposition methods.

The volumes of methane introduced into the reactor during static- and tracked flow-mode operation (Flow A and B) are, respectively, 27, 719 and 539 standard cm$^3$— with the former calculated using the total sealed volume of 2.5 L. The molar quantity of input methane and diamond product was estimated assuming, in the former case, ideal gas behaviour and, in the latter, the density of bulk diamond (3.51 g cm$^{-3}$) and a volume given by the product of the thickness and the nominal substrate area. These assumptions yield the following crude estimates of the percentage conversion of methane carbon to diamond carbon: ~5.8% for static-mode growth, and ~0.2% for tracked flow A or flow B modes at the same $T_{sub}$(~890° C.), i.e. a factor of ~30 difference between the two. The conversion efficiency quoted for static-mode condition surely under-estimates what could be achieved with an extended deposition time t and an optimally designed reactor in which all of the input gas (i.e. if all of the gas residing in the voluminous exhaust line) was available for plasma processing near the substrate. But, even with this proviso, the present data clearly show that static-mode deposition (or an intelligent development therefrom) can offer a much greater process gas utilization efficiency than is achieved in research diamond CVD reactors such as the one used in this study.

Conclusions

The present inventors have shown that diamond can be deposited on a silicon substrate using a MW plasma activated CH$_4$/H$_2$ gas mixture under zero-gas flow (or 'static-mode') conditions. The C$_2$* optical emission intensity (a proxy for the total carbon content in the hot plasma core) was used to confirm that the time dependent loss of carbon from the plasma was linked to the thickness of the resulting diamond film. Faster gas phase carbon depletion rates correlated with growth of thicker diamond films. Both the loss of gas phase carbon and film thickness can be directly linked to growth parameters that are traditionally considered to affect diamond growth — principally substrate temperature, but also the level of nitrogen (air) impurity in the process gas mixture. The as-grown films display morphologies and Raman spectra typical of polycrystalline diamond, and experiments involving different growth times suggest that viable static-mode diamond growth conditions should extend beyond the maximum times (t=90 min) investigated in the present work.

Direct comparison of static- and tracked flow-mode deposition (i.e. depositions carried out with a flowing process gas mixture in which F(CH$_4$) is progressively reduced) emphasizes the similarities of the two modes and finds little difference between samples regarding their sp$^3$/sp$^2$ carbon content or crystalline morphology. Any differences identified are likely attributable to minor differences in process conditions, including the greater time-averaged nitrogen contamination of any static-mode process gas mixture. Carbon balance considerations indicate ~5.8% conversion of input gas phase carbon into diamond during the present t=90 min deposition experiments at $T_{sub}$~890° C.

This is about a 30-fold improvement over that achieved using similar flow-mode conditions and could surely be enhanced further. Therefore, the present invention provides an improved method of growing CVD diamond, offering improved atom efficiency and minimised/no release of undesirable greenhouse gases, which may be particularly advantageous for depositions involving limited, expensive or hazardous feedstock gases.

Although the CVD growth chamber used to carry out the "static-mode" experiments described herein had a low leak rate. The present inventors have found that a hermetically sealed CVD growth chamber is straightforward to provide and would expect that the results obtained would be improved further when employing a hermetically sealed system.

The invention claimed is:

1. A chemical vapor deposition (CVD) process for producing diamond, the process comprising:
   providing a CVD growth chamber containing a growth substrate;
   charging the CVD growth chamber with a gas mixture, the gas mixture comprising a carbon source gas;
   activating the gas mixture to facilitate growth of diamond on the growth substrate; and
   providing for a period of diamond growth during which the gas mixture is sealed within the CVD growth chamber.

2. The process according to claim 1, wherein activating the gas mixture comprises thermally or electrically activating the gas mixture.

3. The process according to claim 2, wherein the gas mixture is electrically activated by applying microwaves to the gas mixture to provide a microwave plasma.

4. The process according to claim 1, wherein the gas mixture comprises a hydrogen source gas, a nitrogen source gas, a boron source gas, or combinations thereof.

5. The process according to claim 1, wherein prior to charging the CVD growth chamber with a gas mixture, the CVD growth chamber is evacuated to a pressure of about 1 µTorr or less.

6. The process according to claim 1, wherein the carbon source gas comprises an increased $^{13}$C content compared to the natural isotopic abundance of $^{13}$C, an increased $^{14}$C content compared to the natural isotopic abundance of $^{14}$C, or 99.9 wt. % $^{12}$C or greater by atom % of the total number of carbon atoms in the carbon source gas.

7. The process according to claim 4, wherein the hydrogen source gas is hydrogen gas (H$_{2(g)}$) comprising an increased tritium content compared to the natural isotopic abundance of tritium, or an increased deuterium content compared to the natural isotopic abundance of deuterium.

8. The process according to claim 1, further comprising monitoring the composition of the gas mixture in the CVD growth chamber.

9. The process according to claim 8, further comprising determining whether the composition of the gas mixture falls outside of a pre-determined growth parameter.

10. The process according to claim 9, further comprising ending the period of diamond growth in response to a determination that the composition of the gas mixture falls outside of a pre-determined growth parameter.

11. The process according to claim 9, further comprising adding a further pre-defined amount of a carbon source gas to the CVD growth chamber in response to a determination that the composition of the gas mixture falls outside of a pre-determined growth parameter.

12. The process according to claim 1, comprising ending the period of diamond growth by evacuating the gas mixture from the CVD growth chamber, optionally evacuating the gas mixture from the CVD growth chamber into a gas capture device.

13. The process according to claim 12 further comprising charging the CVD growth chamber with a second gas mixture following evacuation of the first gas mixture, and activating the second gas mixture to facilitate growth of a second layer of diamond on the growth substrate; and providing for a period of second layer diamond growth during which the gas mixture is sealed within the CVD growth chamber.

14. The process according to claim 13 further comprising ending the period of second layer diamond growth by evacuating the gas mixture from the CVD growth chamber, charging the CVD growth chamber with a third gas mixture following evacuation of the second gas mixture, and activating the third gas mixture to facilitate growth of a third layer of diamond on the growth substrate; and providing for a period of third layer diamond growth during which the gas mixture is sealed within the CVD growth chamber.

15. The process according to claim 13, wherein the first and second gas mixtures, or first, second and third gas mixtures, contain different carbon source gases selected from a carbon source gas which is isotopically pure with respect to $^{12}C$, a carbon source gas comprising an increased $^{13}C$ content compared to the natural isotopic abundance of $^{13}C$, and a carbon source gas comprising an increased $^{14}C$ content compared to the natural isotopic abundance of 14c.

16. The process according to claim 1 for providing an isotopically layered diamond material.

17. The process according to claim 1, wherein providing for the period of diamond growth during which the gas mixture is sealed within the CVD growth chamber comprises providing for the period of diamond growth in a static mode, and wherein there is substantially no flow of the gas mixture during the period of diamond growth in the static mode.

18. The process according to claim 1, wherein providing for the period of diamond growth during which the gas mixture is sealed within the CVD growth chamber comprises providing for the period of diamond growth in a static mode, and wherein there is a flow of the gas mixture of less than about 15 sccm during the period of diamond growth in the static mode.

* * * * *